(12) United States Patent
Li et al.

(10) Patent No.: US 7,898,176 B2
(45) Date of Patent: Mar. 1, 2011

(54) FLUIDIC THERMAL MANAGEMENT ARTICLE AND METHOD

(75) Inventors: Yun Li, Niskayuna, NY (US); Mark Lewis Grabb, Burnt Hills, NY (US); John Erik Hershey, Ballston Lake, NY (US); Jian Zhang, Schenectady, NY (US); Hua Xia, Altamont, NY (US); Gelu Comanescu, Washington, DC (US)

(73) Assignee: General Electric Company, Niskayuna, NY (US)

( * ) Notice: Subject to any disclaimer, the term of this patent is extended or adjusted under 35 U.S.C. 154(b) by 818 days.

(21) Appl. No.: 11/863,722

(22) Filed: Sep. 28, 2007

(65) Prior Publication Data

US 2009/0087640 A1    Apr. 2, 2009

(51) Int. Cl.
*H01J 1/62* (2006.01)
*H01J 63/04* (2006.01)

(52) U.S. Cl. ............ 313/512; 313/483; 313/504; 313/46; 428/304.4; 428/332; 428/411.1; 428/446

(58) Field of Classification Search .................. None
See application file for complete search history.

(56) References Cited

U.S. PATENT DOCUMENTS

| | | | |
|---|---|---|---|
| 5,919,551 A | | 7/1999 | Cobb, Jr. et al. |
| 6,322,236 B1 * | | 11/2001 | Campbell et al. ............. 362/333 |
| 6,755,533 B2 | | 6/2004 | Fraser et al. |
| 7,049,636 B2 | | 5/2006 | Weaver et al. |
| 7,068,418 B2 | | 6/2006 | Kawase |
| 7,402,506 B2 * | | 7/2008 | Levy et al. .................... 438/584 |
| 7,652,280 B2 * | | 1/2010 | Li et al. ............................ 257/13 |
| 7,663,300 B2 * | | 2/2010 | Hack et al. ...................... 313/504 |
| 7,742,673 B2 * | | 6/2010 | Li et al. ........................... 385/129 |
| 2002/0190921 A1 | | 12/2002 | Hilton |

(Continued)

FOREIGN PATENT DOCUMENTS

WO    2004/017678 A2    2/2004

(Continued)

OTHER PUBLICATIONS

Q. Cao, S.-H. Hur, Z.-T. Zhu, Y. G. Sun, C.-J. Wang, M. A. Meitl, M. Shim, J. A. Rogers, "Highly Bendable, Transparent Thin-Film Transistors That Use Carbon-Nanotube-Based Conductors and Semiconductors with Elastomeric Dielectrics", Advanced Materials vol. 18, Issue 3, Date: Feb. 2006, pp. 304-309.

(Continued)

*Primary Examiner* — Nimeshkumar D Patel
*Assistant Examiner* — Natalie K Walford
(74) *Attorney, Agent, or Firm* — Joseph J. Christian

(57) ABSTRACT

An article includes a display layer having an outward facing surface and an inward facing surface. The display layer includes a light-emitting device that generates heat and light during use. A thermal transport layer may be secured to the display layer. The thermal transport layer may include a microfluidic layer including a coolant that can transport heat generated by the light-emitting device away from the light-emitting device. An article includes a display structure having a height, a width, and a thickness that define a volume. The display structure can include components that emit light to generate a three-dimensional image within the volume. The display structure includes a stack. The display structure also includes a thermal dissipation layer in contact with the sheet or stack that can transport generated heat from the sheet or stack to a heat absorbing structure.

36 Claims, 18 Drawing Sheets

U.S. PATENT DOCUMENTS

| | | |
|---|---|---|
| 2003/0168964 A1 | 9/2003 | Chen |
| 2004/0246199 A1 | 12/2004 | Ramian |
| 2006/0113549 A1* | 6/2006 | Den et al. .................. 257/79 |
| 2007/0096118 A1 | 5/2007 | Mahalingam et al. |
| 2009/0087639 A1* | 4/2009 | Li et al. .................. 428/304.4 |

FOREIGN PATENT DOCUMENTS

| | | |
|---|---|---|
| WO | 2004/086123 A1 | 10/2004 |
| WO | 2006/051994 A2 | 5/2006 |
| WO | 2006/078286 A2 | 7/2006 |
| WO | 2006/091823 A2 | 8/2006 |
| WO | 2006/138072 A1 | 12/2006 |

OTHER PUBLICATIONS

Fang Qian, Silvija Gradečak, Yat Li, Cheng-Yen Wen, and Charles M. Lieber; "Core/Multishell Nanowire Heterostructures as Multicolor, High-Efficiency Light-Emitting Diodes"; Nano Letters 2005, vol. 5, No. 11, 2287-2291.

Fang Qian, Yat Li, Silvija Gradečak, Deli Wang, Carl J. Barrelet, and Charles M. Lieber; "Gallium Nitride-Based Nanowire Radial Heterostructures for Nanophotonics"; Nano Letters 2004, vol. 4, No. 10, 1975-1979.

* cited by examiner

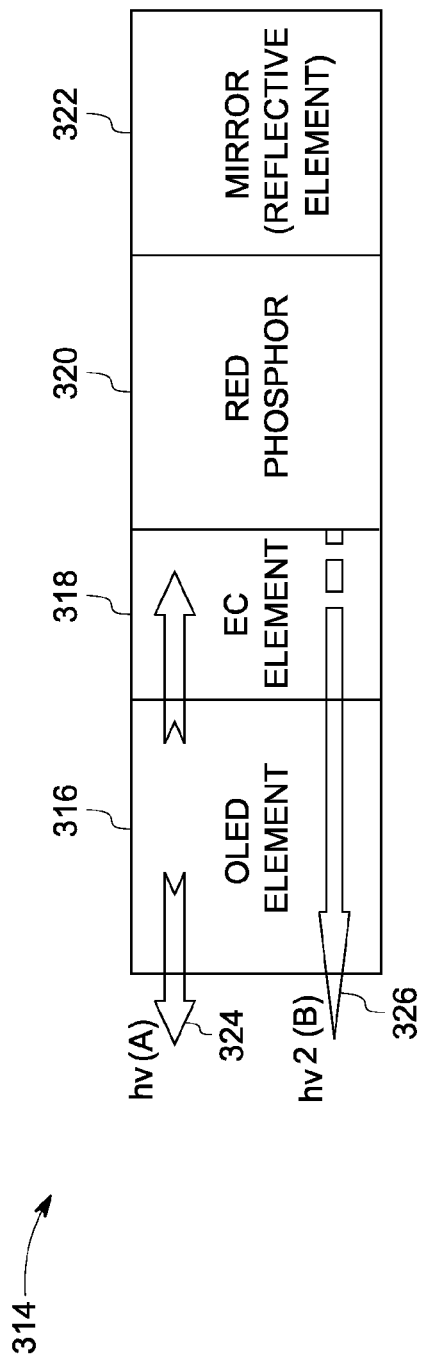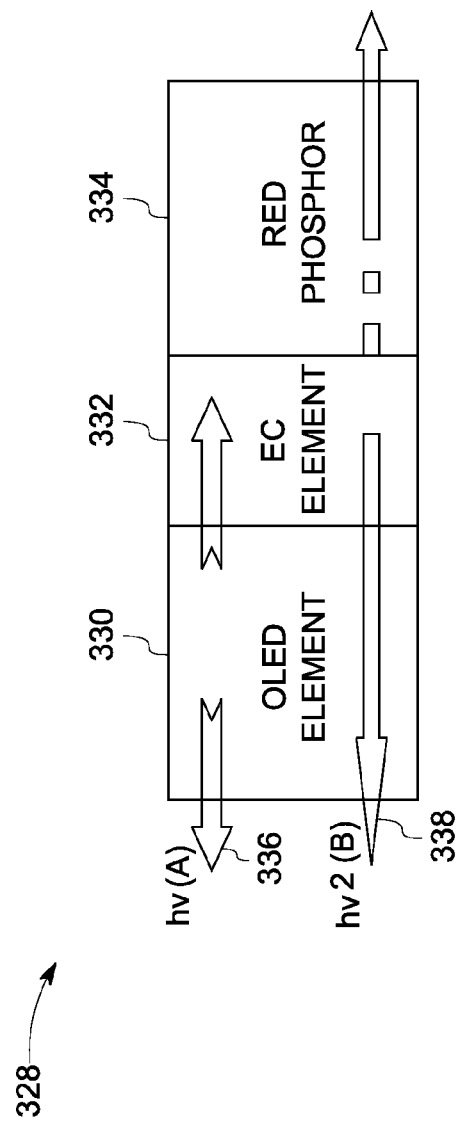

US 7,898,176 B2

FLUIDIC THERMAL MANAGEMENT ARTICLE AND METHOD

BACKGROUND

1. Technical Field

The invention includes embodiments that relate to an article that has a thermal transport layer. The invention includes embodiments of making and of using the article.

2. Discussion of Art

Light-emitting devices ("LEDs") are inorganic chips that can be used as light sources. Some LEDs may be used in electronic displays, as visual traffic control systems, and in general lighting, automotive, and industrial applications.

At present, heat dissipation is an obstacle faced by commercial LEDs, especially in applications that involve the use of LEDs as light sources. LED's useful lifetime and its emitted color or wavelength may be changed in response to an increase in operating temperature. A portion of the current that is applied to the electrodes is converted into thermal energy rather than into light. To maintain the light source at an acceptable operating temperature and to achieve an adequate usage lifetime and to provide constant luminous flux at certain wavelength, such an illumination system may be equipped with a heat removal system.

Some LED-containing systems have thermal management systems. Although partial thermal management can be done by carefully designing LED device, control junction temperature, and forward current, the thermal management system may also include new integration method to effectively dissipate heat energy by employing additional coating layers, microfluidic channels, and packaging method. Usually, a heat sink in communication with a substrate on which the LED is mounted is a simple thermal management solution. The heat sink may dissipate heat with a fan or a piezoelectric jet actuator. While this approach may dissipate some of the heat generated by the LED, it may increase the size and/or footprint of the module. The fan or piezoelectric device may generate noise.

It may be desirable to have a light-emitting article, device or system having a structure, property or characteristic that differs from those currently available. It may be desirable to have a method of making or using the light-emitting article that differs from currently available methods.

BRIEF DESCRIPTION

In one embodiment, an article includes a display layer having an outward facing surface and an inward facing surface. The display layer includes a light-emitting device that generates heat and light during use. A thermal transport layer may be secured to the display layer. The thermal transport layer may include a microfluidic layer including a coolant that can transport heat generated by the light-emitting device away from the light-emitting device.

In one embodiment, an article includes a display structure having a height, a width, and a thickness that define a volume. The display structure can include components that emit light to generate a three-dimensional image within the volume. The display structure includes a stack. The display structure also includes a thermal dissipation layer in contact with the sheet or stack that can transport generated heat from the sheet or stack to a heat absorbing structure. The stack includes at least one layer. The layer includes a substrate, the components that emit light, and a controller. The components that emit light may each be secured to the substrate. The controller may be secured to the substrate. The controller may control the components that emit light to generate a three-dimensional image within the volume. The components that emit light may include organic electronic devices. The controller may be connected to two or more of the organic electronic devices. The components that emit light may include a light-emitting nano-wire device.

BRIEF DESCRIPTION OF THE DRAWINGS

Like numbers represent like parts throughout the drawings, wherein:

FIG. 25 is a schematic representation of an embodiment of a color-tunable light-emitting device;

FIG. 26 is a schematic representation of an embodiment of a color-tunable light-emitting device;

DETAILED DESCRIPTION

Figure 2:
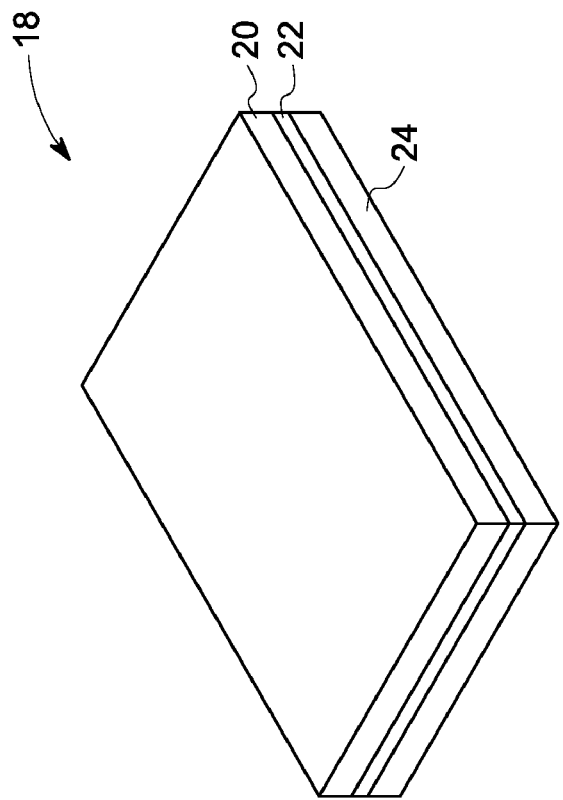
FIG. 2 is a schematic representation of an embodiment of an article according to the invention.

The invention includes embodiments that relate to an article that has a thermal transport layer. The invention includes embodiments of making and of using the article.

Approximating language, as used herein throughout the specification and claims, may be applied to modify any quantitative representation that could permissibly vary without resulting in a change in the basic function to which it is related. Accordingly, a value modified by a term or terms, such as "about" is not limited to the precise value specified. In some instances, the approximating language may correspond to the precision of an instrument for measuring the value. Similarly, "free" may be used in combination with a term, and may include an insubstantial number, or trace amounts, while still being considered free of the modified term. The singular forms "a", "an" and "the" include plural referents unless the context clearly dictates otherwise.

As used herein, the term "secured to" or "disposed over" or "deposited over" or "disposed between" refers to both secured or disposed directly in contact with and indirectly by having intervening layers therebetween. "Operably coupled" is a relationship between listed parts that provides a stated function. Without further qualifiers, "light transmissive" means that greater than about 50 percent of light of at least one frequency in the visible wavelength range transmits through a material of a given thickness. The visible wavelength range is about 400 nanometers to about 700 nanometers. Some materials transmit more or less light based on the wavelength of the light. That is, a material that is light transmissive at one wavelength may be more or less light transmissive at another wavelength.

The term "nano-wire" refers to a wire having one or more dimensions of the order of a few nanometers. The term "light-emitting nano-wire device" refers to a light-emitting device based on nano-wire structures and the nano-wire emits light while driven by external electric current or voltage. The term "three-dimensional image" refers to an image of an object, and the image has properties that allow a viewer to visualize the length, width and height of the object. The length, width and height are the three dimensions required to describe the position and relevant characteristics of any object within a conceptual space, such as for example an optical device capable of providing the feeling of three dimensions, the optical device makes a displayed object have an observable depth.

With reference to one embodiment, an article is provided that has a thermal transport layer and a display layer. The thermal transport layer transports heat that is generated by the article, or by components of the article from the source of the heat generation to a place where the heat can be dissipated. The display layer has an outward facing surface and an inward facing surface. The display layer includes a light-emitting device that generates both heat and light during use.

The thermal transport layer may be secured to the display layer in different ways depending on the region from where heat is generated and from where the heat needs to be removed from the article. The thermal transport layer may be secured to the inward facing surface of the display layer, to the outward facing surface of the display layer, or to both the inward and the outward facing surfaces of the display layer. For example, when a set of display layers are arranged together to form a stack the display layer near the middle of the stack may generate more heat than the display layers near the surface. This may occur due to the lack of heat dissipation towards the middle of the stack as against better heat dissipation towards the surface of the stack through natural radiation. The thermal transport layer may be secured to the inner and outer surfaces of the display layer near the middle to increase dissipation of heat generated by the stack in that region.

In another example, the display layer attached to the innermost surface of the stack may be designed such that it can drive maximum amount of light from the innermost surface to the outer surface of the stack to improve the lighting efficiency of the stack. To achieve this there may be more light-emitting elements or a reversibly opacifying layer secured to the innermost display layer. This may result in the generation of more light and hence more amount of heat in the innermost display layer. Again, the thermal transport layer may be secured to the innermost display layer to help dissipate the heat generated by the stack in that region.

The thermal transport layer may be a monolithic (single integral piece) or may be a plurality of sublayers. The sublayers may be the same as each other, or different. The thermal transport layer may include a polymeric material. Suitable polymeric materials may include acrylics, epoxies, polyamides, polycarbonates, polyimides, polyketones, polyoxy-1,4-phenyleneoxy-1,4-phenylenecarbonyl-1,4-phenylene, polynorbornenes, polyphenyleneoxides, polyethylene naphthalenedicarboxylate (PEN), polyethyleneterephthalate (PET), polyethersulfone (PES), and polyphenylene sulfide (PPS). The thermal transport layer may include a nano-thick metal thin film material. Suitable metals used to make the nano-thick metal thin film may include gold, silver, nickel, and alloys of the foregoing metals.

Other suitable materials for use as the thermal transport layer may include inorganic materials. A suitable inorganic material may include a silica-based material. Suitable silica-based materials may include silicon dioxide based glass, quartz glass, and borosilicate glass. These glass materials may be doped with metal nano-particles which may help to improve the thermal conductivity of the glass materials.

The thermal transport layer may be formed from a light transmissive material. The light transmissive material can be clear i.e., colorless. The light transmissive material may have a color, tint, or optical effect inducing quality (such as opalescence or polarization). Without regard for wavelength or thickness, the amount of light transmitted through the components that emit light may be in a range of from about 60 percent to about 70 percent, from about 70 percent to about 80 percent, or from about 80 percent to about 90 percent of the light. Without regard for percent transmission or thickness, the transmitted light may have a wavelength in a range of from about 400 nanometers to about 500 nanometers, from about 500 nanometers to about 600 nanometers, or from about 600 nanometers to about 700 nanometers. In one embodiment, more than about 50 percent of the light at wavelength of about 550 nanometers is transmitted through the components that emit light without regard for the thickness. The above discussed embodiments on the amount and the wavelength of transmitted light hold true for the thermal transport layer, substrate, the controller, the light-emitting devices, the resultant device and the article made therefrom.

The article may be employed in a variety of lighting and display applications and in some applications there may be a need for flexibility. The thermal transport layer employed in such displays may need to have a flexibility matching if not superior to the display layer. Depending on the type of thermal transport layer used the thermal transport layer may have a flexural strength in a range of from about 10 gigaPascal (GPa) to about 400 GPa. For example, in one embodiment, when the thermal transport layer is made from a polymeric material, the layer may have a flexural strength in a range of from about 10 GPa to about 15 GPa, from about 15 GPa to about 25 GPa, or from about 25 GPa to about 30 GPa. In another embodiment, when the thermal transport layer is made from glass doped with a thermally conductive material, the layer may have a flexural strength in a range of from about 40 GPa to about 50 GPa, about 50 GPa to about 65 GPa, or from about 65 GPa to about 80 GPa. In still another embodiment, when the thermal transport layer is made from a sub-nanometer metal coating material, the layer may have a flexural strength in a range of from about 100 GPa to about 200 GPa, about 200 GPa to about 300 GPa, or from about 300 GPa to about 400 GPa. The flexural strength of the thermal transport layer may be measured using the elastic properties of the layer, such as for example, low elastic modulus, porosity percentage, and upper limit of tensile strain.

Both the thermal transport layer and the display layer each have a refractive index. The difference in the refractive index of the thermal transport layer to the display layer may be such that there may be zero or minimal image distortion in the image output of the article. The refractive index of the thermal transport layer is equal to the refractive index of the display layer. The refractive index difference between the thermal transport layer and the display layer may be less than about 0.1. In one embodiment, the difference may be in a range of from about 0.1 to about 0.08, from about 0.08 to about 0.05, or from about 0.05 to about 0.001. The refractive indices of the thermal transport layer and the display layer may be controlled by doping the thermal transport layer A (material having refractive index $N_A$) with a second transparent material B (material having refractive index $N_B$). If the refractive index of the display layer is $N_D$, the amount of the doping material to be added to the thermal transport layer may be determined by:

$$N_D = f_A N_A + f_B N_B$$

wherein $f_A$ and $f_B$ are the respectively the amounts of the thermal transport material and doping material and the sum total of $f_A$ and $f_B$ is equal to 1.

The thermal transport layer may transport greater than about 50 percent of the heat generated by the light-emitting device away from the light-emitting device. In one embodiment, the thermal transport layer may transport from about 50 percent to about 60 percent, or from about 60 percent to 70 percent, or from about 70 percent to about 80 percent, or from about 80 percent to about 90 percent of the heat generated by the light-emitting device away from the light-emitting device In one embodiment, the thermal transport layer may be a microfluidic layer including a coolant. The microfluidic layer may have at least one inward surface that defines one channel. The channel may be a volume having three enclosing sides and one open side (a groove), or may be a volume closed on all sides (a tube). In one embodiment, the channel may be sandwiched between layers where three sides of one layer defines a trench that has the upper portion open, and the trench open side is then sealed against an adjacent layer, where the net effect is a closed channel. The channel may have various cross sectional profiles including circular, square, rectangular and triangular.

The coolant can circulate through the channel. The coolant can absorb heat from a heat generating or hot region, and can passing through the channel carry the heat. The coolant removes the heat generated by the light-emitting device away from the light-emitting device. The coolant may be circulated through the channels under pressure. The amount of pressure required may be based on the viscosity of the coolant, the width of the channel, the length of the channel, the desired flow rate of the coolant, the activity or heat-generation rate of the heat-source, and the like. The coolant circulation pressure may be greater than about 5 pounds per square inch psi. In one embodiment, the pressure may be in a range of from about 5 psi to about 10 psi, from about 10 psi to about 20 psi, or from about 20 psi to about 30 psi.

The coolant may be selected with reference to one or more of the coolant's (i) refractive index; (ii) non-corrosive; (iii) optical stability under the temperatures generated by the display layer; and (iv) light-transmissive properties. In one embodiment, a fluid including a gas or a liquid may be employed as the coolant. Suitable gases may include nitrogen, inert gases, such as helium and argon, air, carbon dioxide, and low-concentration hydrogen blended with nitrogen. Suitable liquids may include liquids having a viscosity in a range of from about $1 \times 10^{-3}$ pascal second to about $4 \times 10^{-3}$ pascal second, about $4 \times 10^{-3}$ pascal second to about $6 \times 10^{-3}$ pascal second, or from about $6 \times 10^{-3}$ pascal second to about $10 \times 10^{-3}$ pascal second. Examples of suitable liquids include pH-value balanced water, deionized water mixed with ethylene glycol, diethylene glycol, or propylene glycol, and hydrocarbon-based non-corrosive chemical aqueous medium, such as silicone oil, fluorocarbon oil, isopropyl alcohol, methyl alcohol. In one embodiment, the coolant may further include suspended multi-wall nano carbon tubes or nano-metal particles. The use of nano-sized materials may assist in inducing anomalous thermal conductivity increase that may originate from the improvement in heat dispersion.

The coolant and the thermal transport layer may be selected to have respective refractive indices and the refractive index difference between the coolant layer and the thermal transport layer may be less than about 0.1. In one embodiment, the difference may be in a range of from about 0.1 to about 0.08, from about 0.08 to about 0.05, or from about 0.05 to about 0.001. The refractive index of the coolant may be equal to the refractive index of the thermal transport layer.

The coolant and the display layer may be selected to have respective refractive indices and the refractive index difference between the coolant layer and the display layer may be less than about 0.1. In one embodiment, the difference may be in a range of from about 0.1 to about 0.08, from about 0.08 to about 0.05, or from about 0.05 to about 0.001. The refractive index of the coolant may be equal to the refractive index of the display layer. The refractive index of the transport layer, the coolant and the display layer may be such that there may be zero or minimal image distortion.

As noted above the channel may be etched on the polymeric material or silica-based thermal transport layer disposed on the surface of the display layer. The channel may have a length such that the channel may cover greater than from about 20 percent of the surface of the display layer. In one embodiment, the channel may have a length such that the channel may cover from about 20 percent to about 40 percent, from about 40 percent to about 60 percent, from about 60 percent to about 80 percent, or greater than about 80 percent of the surface of the display layer.

The volume defined by the height, length and width of the channels and the area traversed by the channel characterized by number of turns and the pitch of the channel on the surface of the display layer should be sufficient for passing a coolant through the channel without any obstruction thus ensuring that the coolant can carry the heat generated by the light-emitting devices in the display layer away from the display layer. The channel may have an outer diameter of less than about 2.0 millimeters. In one embodiment, the channel may have an outer diameter in a range of from about 0.2 millimeters to about 0.5 millimeters, from about 0.5 millimeters to about 1.0 millimeter, or from about 1.0 millimeter to about 2.0 millimeters. The channel may have an inner diameter of less than about 1.0 millimeter. In one embodiment, the channel may have an inner diameter in a range of from about 0.1 millimeters to about 0.2 millimeters, from about 0.2 millimeters to about 0.6 millimeters, or from about 0.6 millimeters to about 1.0 millimeter. In another embodiment, the inner diameter and the outer diameter of the channel is greater in a zone of the display that generates relatively more heat than in another zone of the display that generates relatively less heat. The channel may have a width of less than about 100 micrometers. In one embodiment, the channel may have a width in a range of from about 50 micrometers to about 60 micrometers, from about 60 micrometers to about 80 micrometers, or from about 80 micrometers to about 100 micrometers. The channel may have a height of less than about 100 micrometers. In one embodiment, the channel may have a height in a range of from about 1 micrometer to about 40 micrometers, from about 40 micrometers to about 80 micrometers, or from about 80 micrometers to about 100 micrometers.

The channel may have less than about 2000 turns to loop back as it traverses the surface defined by the display layer. In one embodiment, the channel may have from about 2 turns to about 200 turns, from about 200 turns to about 1000 turns, or form about 1000 turns to about 2000 turns to loop back as it traverses the surface defined by the display layer. The channel may have a pitch of less than about 50 millimeters. In one embodiment, the channel may have a pitch of from about 5 millimeters to about 15 millimeters, from about 15 millimeters to about 35 millimeters, or from about 35 millimeters to about 50 millimeters.

The channel may be one of a plurality of channels on the surface defined by the display layer. For example, the number of channels may be greater in a zone of the display that generates relatively more heat than in another zone of the display that generates relatively less heat. The zone of the display that generates relatively more heat than another zone of the display that generates relatively less heat may be in the middle of the display. The channel may flow around a peripheral edge of the display layer.

In one embodiment, the thermal transport layer may be a thermally conductive layer. In one embodiment, the thermally conductive material may include an inorganic thermal transport layer that has a relatively high thermal flux capacity.

The inorganic thermal transport layers may be wide-band-gap material, such as diamond-like carbon material, indium tin oxide (ITO), (Al,Zn)-doped ITO, silicon nitride, boron nitride, and gallium nitride. In another embodiment, the inorganic thermal transport layers may include a plurality of nano-particles. For example, the near infrared high-reflectivity properties of the tin oxide based thermal conductive layer can be used effectively transport localized heat energy from the display layers to external heat sink.

In another embodiment, the thermally conductive material may include an organic thermal transport layer that has a relatively high thermal flux capacity. Suitable materials for forming an organic thermal transport layer may include a carbon containing material such as carbon nanotubes, CVD diamond, diamond-like carbon, or thermal pyrolytic graphite. The carbon nanotubes or thermal pyrolytic graphite may be directionally aligned about a plane perpendicular to a plane defined by the display layer. In one embodiment, the thermal transport layer may be an organic nano material having a higher mass density. In one embodiment, thermal transport layer may include a combination of inorganic and an organic material such as polyimide, silicone, polycarbonate, silicon carbide, silica, ITO, and diamond-like film materials.

The thermal transport layer may be disposed on the display surface using variety of methods, such as for example, molecular organic chemical vapor deposition (MOCVD), plasma enhanced chemical vapor deposition (PECVD), molecular beam epitaxy (MBE), magnetron or electronic beam sputtering, and sol-gel spin coating method. When the thermal transport layer includes a microfluidic layer, the channels may then be formed on the disposed thermal transport layer using photo-etching or mask methods.

The thermal transport layer may have a thickness that helps to remove the heat generated by the light-emitting devices in the display layer away from the display layer. The thickness may be defined based on its location with respect to the location of the display layer. The thermal transport layer may have a thickness that is greater in a zone of the display layer that generated relatively more heat than in another zone of the display layer that generates relatively less heat. The zone of the display layer that generates relatively more heat that another zone of the display layer that generated relatively less heat may be in the middle of the display. The zone of the display layer that generates relatively more heat than another zone of the display layer that generated relatively less heat may be in the rear of the display. The thermal transport layer may have a thickness of less than about 1000 micrometers. In one embodiment, the thermal transport layer may have a thickness in a range of from about 100 micrometers to about 400 micrometers, from about 400 micrometers to about 800 micrometers, or from about 800 micrometers to about 1000 micrometers. The desired thickness may be determined by balancing the heat generated by the light-emitting devices in the display layer to the heat dissipated such that the potential heat accumulation inside the display layers may be minimal. For instance, if thermal radiated electromagnetic wave vector k is defined as equal to 2 multiplied by pi divided by lambda, the thickness of the thermal transport layer may be greater than 1 divided by k. For example, if the thermal transport layer is an ITO layer, the thickness may be in a range from about 0.1 micrometers to about 0.4 micrometers.

The materials employed to prepare the thermal transport layer may have a morphology of either a nano-particle, a nano-rod, or a nano-porous structure. The use of nano-sized materials or sub-nano materials may assist in inducing anomalous thermal conductivity increase that may originate from the increase in improvement in the elastic modulus of the material. The improvement in elastic modulus may result in the formation of high-frequency thermally excited waves, which may transport the heat generated inside the display layer away from the display layer. The thermal transport layers may have similar transparency, flexural strength, thickness and other properties as discussed above.

In one embodiment, an article includes a stack of display layers including a display layer having a high-shear modulus sandwiched between two display layers having a low-shear modulus. The display layers include a light-emitting device that generates heat and light during use. The heat generated by the display layers may form localized heat-sources in the stack. The display layer with the high-shear modulus is a thermal transport layer through which the localized heat-sources-induced guided elastic waves propagate along an acoustic waveguide plane and can transport the heat generated by the light-emitting device away from the light-emitting device.

As mentioned above the heat generated by the light-emitting devices in the display layers may generate localized heat-source in the stack. The acoustic waveguide may assist in transporting the heat generated in the localized heat-source in the display layer away from the display layer. The formation of the localized heat-source in the display layer may result in the formation of thermally-excited elastic bulk or plate waves which propagate in the bulk of the display layer. The thermal transport layer may function as the acoustic waveguide to guide the elastic bulk or plate waves away from the display layer.

The acoustic waveguides may propagate through the article via lattice vibration associated guided bulk elastic waves or plate elastic waves. The propagation velocity of the bulk elastic waves is determined by the average longitude velocity of display and thermal transport materials. The velocity range of the plate elastic waves may be determined by shear velocity difference of the display layer material and thermal transport layer material. The elastic waves may be confined to the display layer which has a higher shear modulus and which functions as the heat energy dissipation layer. The display layers that have low-shear modulus provide confinement for the guided elastic waves propagation in the display layer having high-shear modulus by following zigzag paths. The thermally excited guided acoustic waves thus effectively radiate the heat energy to the external heat sink or surrounding via the acoustic waveguide structure.

The thermal transport layer may further include a thermal dissipation layer for dissipation of heat either by thermal radiation associated long-wavelength electromagnetic waves or lattice vibration associated guided elastic waves propagation, or a combination of the electromagnetic and the elastic waves. The thickness of the thermal dissipation layer may be less than the wavelength of the acoustic wave. The thickness of the thermal dissipation layer may be less than the thickness of the thermal transport layer to effectively enhance the heat dissipation performance of the long-wavelength electromagnetic waves by the highly reflective interfaces formed by thermal transport layers. In one embodiment, the thickness of the thermal dissipation layer of 0.1 micrometer to 0.5 micrometer to effectively confine the heat dissipation along thermal transport layer that acts as an acoustic waveguide. In this case, the product of the acoustic wave vector ($k=2\pi/\lambda$) and thermal transport layer thickness may be equal and greater than unity. The thermal transport layers may also function as highly reflective layers for long-wavelength electromagnetic waves in the spectral range of from about 0.7 micrometers to about 20 micrometers.

As discussed above the heat removal with acoustic waveguide structure is based on laterally propagated guided acoustic waves, such as, Lamb and Love plate elastic waves such as guided longitude modes. Lamb waves correspond to a particle displacement vector in the sagittal plane; and Love waves have a particle displacement vector perpendicular to the sagittal plane. As used herein the term sagittal plane means a vertical plane passing through the longitudinal axis that divides the article into left and right portions.

In one embodiment, an article includes a stack of display layers including a display layer having a high refractive index that is sandwiched between two display layers having a low refractive index. The display layers include a light-emitting device that generates heat and light during use. The heat generated by the display layers may form localized heat-sources in the stack. The display layer with the high refractive index is a thermal transport layer through which the localized heat-sources-induced electromagnetic waves propagate along an optical waveguide plane and can transport the heat generated by the light-emitting device away from the light-emitting device.

The optical waveguide transports heat energy generated in the localized heat sources in the thermal transport layer away from the display layer by thermal radiation associated guided electromagnetic waves propagating in the display layers. The display layer with the high-refractive-index may behave as an optical waveguide through which the localized heat-sources-induced long-wavelength electromagnetic waves radiate heat energy along an optical waveguide plane and can transport the heat generated by the light-emitting device away from the light-emitting device by guided optical waves. The optical mode number is proportional to the thickness of the optical waveguide and the root square of refractive indices of the display layers, and is reversely proportional to the wavelength of light. The localized heat sources in the display will radiate or diffuse the heat energy into the display layers having higher refractive index. Since the thermal-induced radiation is of much low energy and most of the radiated light is in the infrared region, the lateral transportation of the long-wavelength light may have negligible effect on the imaging quality for display visualization.

In one embodiment, an article includes a stack of display layers including a thermal transport layer having a high-shear modulus that is sandwiched between two display layers having low-shear modulus. The display layers include a light-emitting device that generates heat and light during use. The heat generated by the display layers may form localized heat-sources in the stack and diffuse or radiate into the thermal transport layers. The localized heat sources-induced guided elastic waves propagate along an acoustic waveguide plane through the thermal transport layer.

In one embodiment, an article includes a stack of display layers including a thermal transport layer having a high refractive index that is sandwiched between two display layers having low refractive index. The display layers include a light-emitting device that generates heat and light during use. The heat generated by the display layers may form localized heat-sources in the stack and diffuse or radiate into the thermal transport layers. The localized heat sources-induced guided electromagnetic waves propagate along an optical waveguide plane through the thermal transport layer.

The thermal transport layer may have a higher shear-modulus, a higher refractive-index, or may have a combination of a higher shear-modulus and higher refractive index. Such a thermal transport layer may accordingly function as an acoustic waveguide, an optical waveguide, and a combination of an optical and an acoustic waveguide. As discussed above, the thermal transport layer can transport heat generated by localized heat-sources in the light-emitting device in the display layer, by electronic transportation, thermal radiation, and lattice vibration from a localized heat-source to an external heat sink. In addition, external airflow or cooling by convection method may also improve heat removal efficiency.

The electromagnetic waves or the acoustic waves may be interfacial waves that may be thermally excited and their propagation is guided either by the display layer or by the thermal transport layer. As discussed above, propagation of these interfacial waves may be governed by the shear elastic modulus or the refractive indices of the display layers and the thermal transport layers. When the shear modulus of the thermal transport layer is lower than that of the display layers, the display layer functions as an acoustic waveguide. When the shear modulus of the thermal transport layers is greater than that of the display layers, the thermal transport layer functions as acoustic waveguide. When the refractive index of the thermal transport layer is lower than that of the display layers, the display layer functions as an optical waveguide. When the refractive index of the thermal transport layers is greater than that of the display layers, the thermal transport layer functions as an optical waveguide.

In one embodiment, a diamond-based materials, such as various carbide thin film, silicon carbide, tungsten carbide, single-wall carbon nanotube may be used as the thermal transport layer that functions as an acoustic waveguide because their higher shear modulus than LED/OLED display material. The layer formed from a carbon-based material, such as diamond-like carbide materials, has a shear modulus of about 400 GPa to 1000 GPa that is much higher than the shear modulus (40-120 GPa) of the display layer. The thickness of the carbon material-based layer H may be greater than the wavelength W of the excited plate waves to effectively remove localized heat generated in the display layer as provided in the equation below:

$$H > m \cdot W$$

wherein m is an integer having a value greater than or equal to 1, and W may have a value of about 200 nanometers to about 400 nanometers when the light emitted is in the visible range of about 400 nanometers to 700 nanometers. In the other embodiment, a diamond-based material may be used as the thermal transport layer that functions as both acoustic and optical waveguides. In one embodiment, the layer formed from a carbon-based material, such as diamond-like carbide materials, may have a high refractive index of from about 2.0 to about 2.4 that is relatively higher than the refractive index of the display layer which ranges from about 1.9 to about 2.0. Suitable materials that may be used to form the thermal transport layers having high refractive indices and or high shear modulus include indium tin oxides ITO, zinc doped tin oxides, aluminum doped tin oxides, magnesium oxide, and alumina. Their refractive indices range from about 1.65 to about 2.0, and their shear modulus range from about 80 GPa to about 150 GPa.

The thermal transport layers and the display layers may include a tunable absorber at the edges to prevent reflections of the heat waves back into the display device. The absorbers may thus help to increase the thermal transfer efficiency of the thermal transport layer. Such an absorber may be a thermo-electric edge layer with modulus controlled and tuned by a variable electric potential.

The light-emitting devices deeper in the stack get more electricity and generate more heat, and so the thermal transport layer, deeper in the stack may have a higher thermal dissipation efficiency. The thermal transport layer may further include a thermal dissipation layer for dissipation of heat either by electronic transportation, thermal radiation, convection or lattice vibration associated guided elastic wave propagation in the display layers. The thickness of the thermal dissipation layer may be less than that of the display layer to effectively enhance the heat dissipation performance of the elastic waves by the highly confined acoustic waveguide and of the long-wavelength electromagnetic waves by the highly confined optical waveguide.

The back display layer in a stack of display layers may generate relatively more heat than the front display layers. The back display layer may require a multilayered thermal transport structure with a higher thermal conduction efficiency than the thermal transport layers in the front of the display layer. The thermal transport layer may have an additional buffer layer that comprises sub-nanometer thick metal coating material, such as a coating of gold, aluminum or titanium metal based nano-thick film which may help to further improve the conductivity of the thermal transport layer.

The heat removal may be enhanced by improving the emissivity of the display material with doping or band-gap engineering process. This technique may be used when the display material includes light transmissive organic light-emitting diodes (OLEDs) material mainly transparent in the ultraviolet-visible or near infrared range. The radiated heat waves or short- and long-wavelength electromagnetic waves may be effectively dissipated by a refractive index modulated optical waveguide structure as described above by employing display layers structure using low refractive-index and high refractive-index display layers. The display layers with higher refractive index form optical waveguides for the electromagnetic waves to propagate from inside the display layers to outside the display layer and therefrom to the external coolant reservoir.

For example, if the refractive-index n(display) of the display layer is higher than the refractive index of the thermal transport layer n(transport), the guided light waves are confined to propagate within the thickness of the display layers. The mode number N may be determined by the equation:

$$N = \pi \cdot h / \lambda \sqrt{(n^2(\text{display}) - n^2(\text{transport}))}$$

wherein h is the thickness of the display layer, and λ is the wavelength of local heat energy radiate light wavelength. When N is greater than 2.4, a multimode condition for the localized heat to radiate electromagnetic waves may be satisfied. The subsequent propagation of these waves inside the optical waveguide may effectively dissipate the heat to external light absorption reservoir by controlling the value of N at greater than about 2.4. In one embodiment, the thicker the display layer the better thermal dissipation efficiency.

There may be a plurality of heat dissipating structures around the peripheral edge of the display layer in thermal communication with the thermal transport layer. The heat dissipating structures may include a synthetic jet, a heat exchanger, a heat spreader, a heat sink, a radiator, one or more Peltier devices and a heat pipe. The heat dissipating structures function to remove the heat absorbed by the thermal transport layer from the display layer away from the thermal transport layer to maintain cooling efficiency of the thermal transport layer. When the thermal transport layer is a microfluidic layer including a coolant, the coolant carrying heat away from the article may require cooling. The coolant may be circulated through a heat exchanger and the cooled coolant may be re-circulated back through the channels in the display layer. In another embodiment, when the thermal transport layer is an inorganic or organic layer the heat spread and conducted to the sides of the display layer may be removed by using the heat dissipating structures.

The heat dissipating structures may further be in thermal communication with a heat absorbing structure. In one embodiment, the heat dissipating structure may be in thermal communication with the heat absorbing structure via a non-transparent highly thermally conductive material. In one embodiment, the heat absorbing structure is a heat exchanger. Suitable heat absorbing structures include thermally conductive materials such as metalized sheets, conductive glass coating, and porous structural carbon films. In another embodiment, the heat absorbing device may be air-flow or convection cooling.

One embodiment provides a display layer that may be part of a stack of display layers. The stack may be a three-dimensional display stack. At least one thermal transport layer may be embedded in-between the display layers in the stack. In one embodiment, the stack may include at least two thermal transport layers for every display layer of the stack.

In one embodiment, the display layer may include a substrate and a light-emitting device may be secured to the substrate. The substrate may be formed from a light transmissive material. The substrate may be chosen from a group of rigid substrates and flexible substrates. The rigid substrates include but are not limited to glass, metal and plastic; and the flexible substrates include flexible glass, metal foil, and plastic films. Non-limiting examples of glass may include quartz glass and borosilicate glass. Non-limiting examples of plastic may include organic polymers. Suitable organic polymers may include polymers chosen from acrylics, epoxies, polyamides, polycarbonates, polyimides, polyketones, polyoxy-1,4-phenyleneoxy-1,4-phenylenecarbonyl-1,4-phenylene, polynorbornenes, polyphenyleneoxides, polyethylene naphthalenedicarboxylate (PEN), polyethylene terephthalate (PET), polyether sulfone (PES), and polyphenylene sulfide (PPS), and the like. The substrate forms a part of the device and may also be a separate substrate layer relative to the organic electronic devices.

The light-emitting device (LED) may include an inorganic light-emitting device. Inorganic light-emitting devices known in the art are built on an n-type base support, with an electrode attached to a p-type layer that is deposited on the surface of the n-type substrate. A variety of inorganic semiconductor materials may be used as the n-type and p-type materials depending on the color output required from the inorganic light-emitting device. Suitable p-type materials may include aluminium gallium arsenide (AlGaAs; red and infrared), aluminium gallium phosphide (AlGaP; green), aluminium gallium indium phosphide (AlGaInP; high-brightness orange-red, orange, yellow, and green), gallium arsenide phosphide (GaAsP; red, orange-red, orange, and yellow), gallium phosphide (GaP; red, yellow and green), gallium nitride (GaN; green, pure green, emerald green, and blue), gallium nitride with aluminium gallium nitride (AlGaN) quantum barrier (white), indium gallium nitride (InGaN; near ultraviolet, bluish-green and blue), diamond (C; ultraviolet), zinc selenide (ZnSe; blue), aluminium nitride (AlN; near to far ultraviolet), aluminium gallium nitride (AlGaN; near to far ultraviolet), and aluminium gallium indium nitride (AlGaInN; near to far ultraviolet). Suitable n-type materials may include silicon carbide and silicon (SiC and Si; blue colored base support), and sapphire (Al2O3; blue colored base support).

The inorganic light-emitting device may include a light-emitting nano-wire device. The light-emitting nano-wire device may be light transmissive. With regard to the light-emitting nano-wire device, it may include an electrically conductive element and a light-emitting nano-wire device including at least one p-n or p-i-n diode. The electrically conductive element may be light transmissive.

The light-emitting nano-wire device may be a p-n diode or multiple p-n diodes. In various embodiments, the light-emitting nano-wires may be oriented either in a vertical direction or in a horizontal direction in the light-emitting nano-wire device. In a light-emitting p-n diode, light emits at interface of p-type segment and n-type segment. Some light emitted along the axis of the nano-wire may be absorbed by the nano-wire. The light-emitting nano-wire device may be a p-i-n diode or multiple p-i-n diodes. In a p-i-n diode, light emits from the i-layer. The i-layer is a quantum well or multiple quantum wells. P-segment and n-segment in the nano-wire have larger band-gap than the i-layer and therefore are transparent to the light emitted along the nano-wire axis. The light-emitting nano-wire may be a core layer/inner shell/outer shell radial p-n junction or p-i-n heterojunction. The core layer may include either a p-type or an n-type semiconductor. The outer shell may include either an n-type or a p-type semiconductor, such that a p-n junction may be formed between the core layer and the outer shell. An inner shell may be inserted between the core layer and the outer shell. The inner shell may be an undoped layer, a quantum well or multiple quantum wells capable of emitting light.

The electrically conductive element may include a single component including any useful conductive material. The electrically conductive element may additionally include a light transmissive substrate wherein the conductive material may be disposed on the light transmissive substrate to provide the electrically conductive element. Suitable materials that may be used as the light transmissive substrate may be the same as or similar to the substrate described above. Suitable materials that may be used as the conductive material may be the same as or similar to the conductive material used in the source/drain electrodes described above for the controller. Suitable light transmissive controllers may include the light transmissive controllers described above.

The light-emitting nano-wire device may include multiple nano-wire light-emitting diodes. Each may include a structure of a p-type semiconducting segment and an n-type semiconducting segment. Optionally, an undoped light-emitting segment is inserted between p-type segment and n-type segment. Suitable materials that may be used as the light-emitting nano-wires include a semiconductor light-emitting material selected from III-V or II-VI semiconductors with a direct bandgap. Suitable semiconductor materials may include gallium nitride, zinc selenide, gallium arsenide, or zinc oxide.

The light-emitting nano-wire device may include a cover layer disposed on the electrically conductive element. The cover substrate may provide a more robust light-emitting nano-wire device. Suitable materials that may be used as the cover substrate may be the same as or similar to the material described above for the light transmissive substrate.

The cover substrate may have a surface plated with a metal layer. Suitable materials that may be used as metal layer include Al, Ag, Au, Ba, Ca, In, K, Li, Mg, Mn, Na, Pb, Sr, Sn, Sc, Y, Zn, Zr, and elements of the lanthanide series. Other suitable materials may include metal alloys, such as Ag—Mg alloy, Al—Li alloy, In—Mg alloy, Al—Ca alloy, Li—Al alloy, and Ca—Ga alloy. The metal layer on the cover substrate and the electrically conductive element may serve as electrode conductors.

The nano-wire light-emitting diodes may be grown using a vapor phase-liquid phase-solid phase (VLS) growth technique or a metal-organic chemical vapor deposition (MOCVD) growth technique.

A layer of a metal catalyst may be deposited by e-beam evaporation, thermal evaporation or sputtering on the surface of the electrically conductive element and the coated element may be placed in an oven to heat to a temperature of about 400 degrees Celsius to about 1000 degrees Celsius resulting in the formation of nano sized catalytic nano-particles. This may be followed by passing vapors of precursors containing a semiconductor light-emitting material and suitable dopants to form p-type semiconductor and n-type semiconductor over the catalytic nano-particles resulting in the growth of nano-wire light-emitting diodes on the surface of the electrically conductive element. The light-emitting nano-wires may be grown on the cover substrate in a similar manner as described above. Suitable materials that may be used as the metal catalyst may include gold, nickel, iron, cobalt, and/or titanium. The thickness of the layer of metal catalyst is in a range of from about 1 nanometer to about 50 nanometers. The catalyst may be uniformly dispersed catalytic nano-particles.

Optionally, an insulation layer support post may be disposed between the electrically conductive element and the cover substrate for supporting the electrically conductive element and the cover substrate. The insulation layer support post may be disposed on the electrically conductive element. The insulation layer support post may be disposed on the cover substrate. Suitable materials that may be used to make the insulation layer support post include silica and a heat-proof light-resistant material.

The light-emitting nano-wire device include nano-wire light-emitting diodes which may form a light-emitting block, and a single light-emitting block or multiple light-emitting blocks may form a planar light source. The nano-wire light-emitting diodes may emit rays in a wavelength region of about 350 nanometers to 395 nanometers (ultraviolet rays), or in a wavelength region of about 395 nanometers to about 420 nanometers (violet rays), or in a wavelength region of about 420 nanometers to about 430 nanometers (yellow rays), or in a wavelength region of about 430 nanometers to about 470 nanometers (blue rays).

The light-emitting devices may include organic electronic light-emitting devices (OLEDs). The OLED may include a first electrode anode and a second electrode cathode. An electroluminescent layer is disposed between the first electrode and the second electrode. The first electrode and second electrode are operably coupled to at least one tunable voltage source. The organic electronic device may be light transmissive.

Suitable anodes may include a material having a high work function; e.g., greater than about 4.0 electron volts. The anode material work function may be in a range of from about 5 electron volts to about 6 electron volts, or from about 6 electron volts to about 7 electron volts. Transparent metal oxides may be used as the anode. Transparent metal oxide is light transmissive and allows light emitted from the organic emissive layer to escape through the transparent metal oxide anode without being seriously attenuated. Suitable materials for use as the anode may include indium tin oxide. Other materials suitable for use as the anode are tin oxide, indium oxide, zinc oxide, indium zinc oxide, zinc indium tin oxide, antimony oxide, and the like. The anode thickness may be greater than about 10 nanometers. In one embodiment, the thickness may be in the range of from about 10 nanometers to about 50 nanometers, from about 50 nanometers to about 100 nanometers, or from about 100 nanometers to about 200 nanometers.

A thin transparent layer of a metal may be suitable for the anode. A transparent metal layer may have a thickness of less than or equal to about 50 nanometers. The metal thickness may be in a range of from about 10 nanometers to about 20 nanometers, from about 20 nanometers to about 30 nanometers, or from about 30 nanometers to about 50 nanometers. Suitable metals for the anode may include, for example, silver, copper, tungsten, nickel, cobalt, iron, selenium, germanium, gold, platinum, aluminum, or mixtures thereof or alloys thereof. The anode may be deposited on the underlying element by a technique such as physical vapor deposition, chemical vapor deposition, or sputtering.

The cathode injects negative charge carriers electrons into the organic emissive layer and may be made of a material having a low work function; for example, less than about 4 electron volts. Not every material suitable for use as the cathode need have a low work function. Materials suitable for use as the cathode may include K, Li, Na, Mg, Ca, Sr, Ba, Al, Ag, In, Sn, Zn, Zr, Sc, and Y. Other suitable materials may include elements of the lanthanide series, alloys thereof, or mixtures thereof. Examples of suitable alloy materials for the manufacture of cathode layer may include Ag—Mg, Al—Li, In—Mg, and Al—Ca alloys. Layered non-alloy structures may be used. Such layered non-alloy structures may include a thin layer of a metal such as Ca having a thickness in a range of from about 1 nanometer to about 50 nanometers. Other such layered non-alloy structures may include a non-metal such as LiF, KF, or NaF, over-capped by a thicker layer of some other metal. A suitable other metal may include aluminum or silver. The cathode may be deposited on the underlying layer by, for example, physical vapor deposition, chemical vapor deposition, or sputtering.

Suitable OLEDs may include an electroluminescent layer, which may be referred to as an organic emissive layer or as a light-emitting layer. Electroluminescent (EL) materials refer to organic fluorescent and/or phosphorescent materials. Electroluminescent materials emit light when subjected to an applied voltage bias. Electroluminescent materials may be tailored to emit light in a determined wavelength range. In one embodiment, the thickness of the electroluminescent layer may be greater than about 40 nanometers. In one embodiment, the thickness may be in a range of from about 40 nanometers to about 100 nanometers, from about 100 nanometers to about 200 nanometers, or from about 200 nanometers to about 300 nanometers. The electroluminescent material may be a polymer, a copolymer, or a mixture of polymers. Suitable electroluminescent materials may include poly N-vinylcarbazole (PVK) and its derivatives; polyfluorene and its derivatives, such as polyalkylfluorene, for example poly-9,9-dihexylfluorene, polydioctylfluorene, or poly-9,9-bis-3,6-dioxaheptyl-fluorene-2,7-diyl; poly para-phenylene and its derivatives, such as poly-2-decyloxy-1,4-phenylene or poly-2,5-diheptyl-1,4-phenylene; polyp-phenylene vinylene and its derivatives, such as dialkoxy-substituted PPV and cyano-substituted PPV; polythiophene and its derivatives, such as poly-3-alkylthiophene, poly-4,4'-dialkyl-2,2'-bithiophene, poly-2,5-thienylene vinylene; polypyridine vinylene and its derivatives; polyquinoxaline and its derivatives; and polyquinoline and its derivatives. In one embodiment, a suitable electroluminescent material is poly-9,9-dioctylfluorenyl-2,7-diyl end capped with N,N-bis 4-methylphenyl-4-aniline. Mixtures of these polymers or copolymers based on one or more of these polymers may be used.

Other suitable materials that may be used as electroluminescent materials are polysilanes. Polysilanes are linear polymers having a silicon-backbone substituted with an alkyl and/or aryl side groups. Polysilanes are quasi one-dimensional materials with delocalized sigma-conjugated electrons along polymer backbone chains. Examples of polysilanes include poly di-n-butylsilane, poly di-n-pentylsilane, poly di-n-hexylsilane, polymethyl phenylsilane, and poly bis p-butyl phenylsilane.

In one embodiment, organic materials having molecular weight of less than about 5000, including aromatic units, may be used as electroluminescent materials. An example of such a material is 1,3,5-tris N-4-diphenylamino phenyl phenylamino benzene, which emits light in the wavelength range of from about 380 nanometers to about 500 nanometers. These electroluminescent layer organic materials may be prepared from organic molecules such as phenylanthracene, tetraarylethene, coumarin, rubrene, tetraphenylbutadiene, anthracene, perylene, coronene, or their derivatives. These materials may emit light having a maximum wavelength of about 520 nanometers. Still other suitable materials include the low molecular-weight metal organic complexes. Such complexes may include aluminum-acetylacetonate, gallium-acetylacetonate, and indium-acetylacetonate, which emit light in the wavelength range of about 415 nanometers to about 457 nanometers. Other suitable complexes may include aluminum picolymethylketone bis-2,6-dibutylphenoxide and scandium-4-methoxy picolyl methyl ketone-bis acetyl acetonate, which emit light having a wavelength in a range of from about 420 nanometers to about 433 nanometers. Other suitable electroluminescent materials that emit in the visible wavelength range may include organo-metallic complexes of 8-hydroxyquinoline, such as tris-8-quinolinolato aluminum and its derivatives.

The OLED may further include one or more layers such as a charge transport layer, a hole transport layer, a hole injection layer, a hole injection enhancement layer, an electron transport layer, an electron injection layer and an electron injection enhancement layer or any combinations thereof. The OLED may further include a light transmissive substrate layer.

Non-limiting examples of materials suitable for use as charge transport layers may include low-to-intermediate molecular weight organic polymers for example, organic polymers having weight average molecular weights Mw of less than about 200,000 grams per mole as determined using polystyrene standards for example, poly-3,4-ethylene dioxy thiophene (PEDOT), polyaniline, poly-3,4-propylene dioxythiophene (PPropOT), polystyrene sulfonate (PSS), polyvinyl carbazole (PVK), and other like materials.

Non-limiting examples of materials suitable for a hole injection enhancement layer may include arylene-based compounds such as 3,4,9,10-perylene tetra-carboxylic dianhydride, bis-1,2,5-thiadiazolo-p-quino bis-1,3-dithiole, and like materials.

Non-limiting examples of materials suitable for the hole transport layer may include triaryldiamines, tetraphenyldiamines, aromatic tertiary amines, hydrazone derivatives, carbazole derivatives, triazole derivatives, imidazole derivatives, oxadiazole derivatives including an amino group, polythiophenes, and like materials. Non-limiting examples of materials suitable for a hole-blocking layer may include poly N-vinyl carbazole, and like materials.

Non-limiting examples of materials suitable for a hole-injection layers may include "p-doped" proton-doped conducting polymers, such as proton-doped polythiophene or polyaniline, and p-doped organic semiconductors, such as tetrafluorotetracyanoquinodimethane (F4-TCQN), doped organic and polymeric semiconductors, and triarylamine-containing compounds and polymers. Non-limiting examples of electron-injection materials may include polyfluorene and its derivatives, aluminum tris-8-hydroxyquinoline (Alq3), organic/polymeric semiconductors n-doped with alkali alkaline earth metals, and the like.

Non-limiting examples of materials suitable for the electron injection enhancement layer materials and electron transport layer materials may include metal organic complexes such as oxadiazole derivatives, perylene derivatives, pyridine derivatives, pyrimidine derivatives, quinoline derivatives, quinoxaline derivatives, diphenylquinone derivatives, nitro-substituted fluorene derivatives, and like materials.

The organic electronic device may include a color-tunable light-emitting device. The color-tunable light-emitting device may include a first light-emitting element, a second light-emitting element, an active light transformative element and/or a passive light transformative element, and at least one light transmissive element, wherein the first light-emitting element and the second light-emitting element emit light at differing wavelengths. The color-tunable light-emitting device may be a light transmissive device.

The first light-emitting element and the second light-emitting element may include an OLED. The OLED used may be the same as or similar to those described above. The active light transformative element may include at least one element chosen from the group of electrochromic elements, photochromic elements, and thermochromic elements. The active light transformative element may be disposed between the first light-emitting element and the second light-emitting element. In certain embodiments, a combination of the electrochromic element and/or photochromic element and/or thermochromic element may be used in color-tunable light-emitting device to modulate the light emitted from the device. When an electrochromic element is used the transmission of the electrochromic element can be varied by varying an applied bias. The perceived color of the light emerging from the device is thus a combination of the light emerging directly from the color-tunable light-emitting device and the light modulated by the electrochromic element. When a photochromic element is used, the photochromic element can be tuned by coupling with a light tunable source. When a thermochromic element is used the thermochromic element can be tuned by coupling with a temperature tunable source.

Active light transformative elements modulate light passing through them in response to and as a function of an applied bias as discussed above. Applying bias to a lesser or greater extent is tuning. Electrochromic, photochromic and thermochromic materials known in the art may be used as the active light transformative element.

Examples of suitable electrochromic elements may include inorganic metal oxides, most transition metal oxides (e.g., WO3, V2O5, and the like), electroconductive polymers, and the like. Suitable electroconductive polymers may include unsubstituted and substituted polyaniline, polythiophene and polypyrrole. Examples of suitable electrode materials for use in the electrochromic elements are transparent metal oxides, such as ITO, fluorine doped SnO2, and the like; semi-transparent thin metals such as gold; and conducting polymers, such as poly-3,4-ethylenedioxythiophene/polystyrene sulfonate (PEDOT/PSS), and like materials. Ion conductors and electrolytes may be employed as components of the electrochromic element in the color-tunable light-emitting device. Examples of suitable ion conductors and electrolytes include liquid electrolyte solutions, such as lithium perchlorate in propylene carbonate, and ionic liquids; gel electrolytes including a polymeric material e.g., polyvinyl butyral, polyethylene oxide, polymethyl methacrylate, and polyethylene glycol, a lithium salt, and a solvent, and solid polymeric electrolytes. Suitable lithium salts may include LiClO4, LiCF3SO3, LiCl, and LiPF6. Suitable solvents may include one or more of propylene carbonate, acetonitrile, ethylene carbonate, and the like. Suitable solid polymeric electrolytes may include cured or crosslinked polyacrylates, polyurethanes, and the like.

Suitable photochromic materials include asymmetric photochromic compounds. Pyran derivatives may be used as photochromic material in the photochromic element. Suitable pyran derivatives may include 3,4-diphenylaminophenyl-1-3-2-fluorophenyl-3H-naphtho (2,1-b) pyran; 3,4-dimethyl aminophenyl-3,2-fluorophenyl-3H-naphtho (2,1-b) pyran; 3,2-fluorophenyl-3-(4-N-morpholinylphenyl)-3H-naphtho (2,1-b) pyran; 3,2-fluorophenyl-3-(4-N-piperidinylphenyl)-3H-naphtho (2,1-b) pyran; 3-4-dimethylaminophenyl-6-N-morpholinyl-3-phenyl-3H-naphtho (2,1-b) pyran; 6-N-morpholinyl-3-(4-N-morpholinylphenyl)-3-phenyl-3H-naphtho (2,1-b) pyran; 6-N-morpholinyl-3-phenyl-3-(4-N-piperidinyl phenyl)-3H-naphtho (2,1-b) pyran; and 6-N-morpholinyl-3-phenyl-3-(4-N-pyrrolidinylphenyl)-3H-naphtho (2,1-b) pyran; and mixtures of two or more of the foregoing. Other suitable photochromic materials may include photochromic indeno (2,1-f) naphtho (1,2-b) pyrans and spiro-9-fluoreno (1,2-b) pyrans. The photochromic element may include a cured photochromic polymerizable composition.

Suitable thermochromic materials may contain an acid-responsive chromogenic substance and an acidic substance. Suitable acid-responsive chromogenic substances may include triphenylmethanephthalide compounds, phthalide compounds, phthalan compounds, acyl-leucomethylene blue compounds, fluoran compounds, triphenylmethane compounds, diphenylmethane compounds, spiropyran compounds, and the like. Other suitable acid-responsive chromogenic substances include 3,6-dimethoxyfluoran; 3,6-dibutoxyfluoran; 3-diethylamino-6,8-dimethylfluoran; 3-chloro-6-phenylaminofluoran; 3-diethylamino-6-methyl-7-chlorofluoran; 3-diethylamino-7,8-benzofluoran; 2-anilino-3-methyl-6-diethylaminofluoran; 3,3',3"-trisp-dimethylamino phenylphthalide, 3,3'-bis p-dimethylamino phenyl phthalide; 3-diethylamino-7-phenylamino fluoran; 3,3-bis p-diethylaminophenyl-6-dimethylamino phthalide; 3,4-diethylamino phenyl-3,1-ethyl-2-methylindol-3-ylphthalide; 3,4-diethylamino-2-methylphenyl-3,1,2-dimethylindol-3-ylphthalide; and 2',2-chloroanilino-6'-dibutylamino spiro phthalido-3,9'-xanthene. Suitable acidic substances include 1,2,3-benzotriazole compounds, phenol compounds, thiourea compounds, oxo-aromatic carboxylic acids, and the like. Specific examples of acidic compounds include 5-butylbenzotriazole; bis benzotriazole-5-methane; phenol; nonylphenol; bisphenol A; bisphenol F; 2,2'-biphenol; beta-naphthol; 1,5-dihydroxynaphthalene; alkyl p-hydroxybenzoates, phenol resin oligomer, and the like. The thermochromic materials may be used with a solvent. The use of a solvent may render the material responsive to change in temperature with greater sensitivity and definition. Suitable solvents may include alcohols; alcohol-acrylonitrile adducts; azomethine compounds; esters; and the like. Among specific examples of the solvent are decyl alcohol; lauryl alcohol; myristyl alcohol; cetyl alcohol; stearyl alcohol; behenyl alcohol; lauryl alcohol-acrylonitrile adduct; myristyl alcohol-acrylonitrile adduct; stearyl alcohol-acrylonitrile adduct; benzylidene-p-toluidine; benzylidene-butylamine; octyl caprate; decyl caprate; myristyl caprylate; decyl laurate; lauryl laurate; myristyl laurate; decyl myristate; lauryl myristate; cetyl myristate; lauryl palmitate; cetyl palmitate; stearyl palmitate; cetyl p-t-butylbenzoate; stearyl 4-methoxybenzoate; dilauryl thiodipropionate; dimyristyl thiodipropionate; stearyl benzoate; benzyl stearate; dibenzyl thiodipropionate; distearyl thiodipropionate; benzyl benzoate; and glycerol trilaurate.

Other suitable thermochromic materials may include intrinsically thermochromic material. Intrinsically thermochromic materials include chromophores that are chemically altered on heating without the need for an external reagent, and which change color in the process. Thermochromic colors including Fast Yellow Gold Orange, Vermillion, Brilliant Rose, Pink, Magenta, Fast Blue, Artic Blue, Brilliant Green, Fast Black, Green Brown and mixtures of the foregoing may be used in the thermochromic element. Rylene dyes may be employed in the thermochromic element. Reversible thermochromic pigments that change color in the presence of diaminoalkane activators may be used as the thermochromic element.

Passive light transformative elements employed in certain embodiments of the color-tunable light-emitting devices may include color filters and phosphors. A suitable color filter may be a sheet of dyed glass, gelatin, or plastic that absorbs certain colors and permits better rendition of others.

A phosphor exhibits the phenomenon of phosphorescence. Phosphorescence may be defined as sustained light emission following an initial exposure to light. This is sometimes referred to as "glowing without further stimulus". Suitable phosphors may include one or more transition metal compounds or rare earth compounds. The term "transition metal" refers to an element in the d-block of the periodic table, including zinc and scandium. This corresponds to periodic table groups 3 to 12, inclusive. Compounds of the "inner transition elements" from the lanthanide and actinide series where the inner f orbital is filled as atomic number increases may also be used as the phosphor. The inner transition elements are made up of the elements from cerium to lutetium; and thorium to Lawrencium. Suitable rare earth compounds include oxides of the elements in the lanthanide series that include actinium, thorium, protactinium, uranium, neptunium, plutonium, americium, curium, berkelium, californium, einsteinium, fermium, mendelevium, nobelium and lawrencium.

The reflective elements that can be employed in certain embodiments include mirrors and retroreflective layers. Mirrors may be formed from highly reflective metallic foils or metal film on a substrate.

The display layer may further comprises a controller. The controller may be light transmissive. The controller may be a transparent thin film transistor TFT. A TFT is an active device, which is the building block for electronic circuits that switch and amplify electronic signals. Attractive TFT device characteristics include a low voltage to turn it on, a high transconductance or device current to gate control-voltage ratio Vg, and a high 'on' Vg greater than 0 current to 'off' Vg less than or equal to 0 current ratio. The TFT may be fabricated in such a manner that materials used in the different elements of the TFT, such as a source electrode, a drain electrode, a gate electrode, a gate dielectric and a substrate, should result in a transparent TFT.

The substrate can be used as a support during the manufacturing, testing, and/or use of the TFTs. The substrate used may be same or similar to the substrate as discussed above. Depending on the method of making the transistor, the substrate may be an optional element. The support may not provide any necessary electrical function for the TFT and hence functions as an insulator. Suitable substrate materials may include organic or inorganic materials and may be rigid or flexible. Suitable substrates include inorganic materials and inorganic materials. The inorganic materials suitable for substrates may include glass, ceramic, and metal. The organic materials may include polymeric materials such as acrylics, epoxies, polyamides, polycarbonates, polyimides, polyketones, polyoxy-1,4-phenyleneoxy-1,4-phenylenecarbonyl-1,4-phenylene, polynorbornenes, polyphenyleneoxides, polyethylene naphthalenedicarboxylate (PEN), polyethylene terephthalate (PET), polyether sulfone (PES), and polyphenylene sulfide (PPS). The ceramics and the organics may be reinforced with, for example, fibers and/or particles. Flexible substrates may be thin metal foils provided they are coated with an insulating layer to electrically isolate the thin film transistor.

Conductive materials may be used as the gate electrode. Suitable conductive materials include doped silicon, or a metal, such as aluminum, chromium, gold, silver, nickel, copper, tungsten, palladium, platinum, tantalum, and titanium, transparent conductors such as indium-tin oxide (ITO), zinc oxide, tin II oxide, or lanthanum III dioxide; conductive polymers such as polyaniline, poly 3,4-ethylene dioxythiophene and polystyrene sulfonate (PEDOT:PSS). In addition, alloys, combinations, and multilayers of these materials may be useful. The same material may provide the gate electrode function and also provide the support function of the substrate. For example, doped silicon can function as the gate electrode and the substrate for TFT. The thickness of the gate electrode may be such that the gate electrode does not hinder or reduce the efficiency of light transmitted through the device.

In a TFT, the gate dielectric contacts the gate electrode. This gate dielectric electrically insulates the gate electrode from the balance of the TFT device. Thus, the gate dielectric includes an electrically insulating material. The gate dielectric should have a suitable dielectric constant that can vary widely depending on the particular device and circumstance of use. For example, a dielectric constant of from about 2 to about 100 may be available as a gate dielectric. Suitable materials that may be used for the gate dielectric may include one or more strontiates, tantalates, titanates, zirconates, aluminum oxides, silicon oxides, tantalumoxides, titanium oxides, silicon nitrides, barium titanate, barium strontium titanate, barium zirconate titanate, zinc selenide, or zinc sulfide. In addition, alloys, combinations, and multilayers of the foregoing; polymeric materials such as polyimides, polyvinyl alcohol, poly-4-vinylphenol, polyimide, and polyvinylidene fluoride, polystyrene and substituted derivatives thereof, polyvinyl naphthalene and substituted derivatives, and polymethyl methacrylate. In one embodiment, the thickness of the gate dielectric is such that the gate dielectric does not hinder or reduce the efficiency of light transmitted through the device.

Source/drain electrodes refer to the terminals of a TFT, between which conduction occurs under the influence of an electric field. The source electrode and drain electrode are separated from the gate electrode by at least the gate dielectric, while the conducting channel can be over or under the source electrode and drain electrode. The source and drain electrodes can be any useful conductive material. Suitable materials include most of those materials described above for the gate electrode. These gate electrode materials may include aluminum, barium, calcium, chromium, gold, silver, nickel, palladium, platinum, titanium, copper, and tungsten. Other gate electrode materials may be a conductive polymer, such as polyaniline. Other suitable materials may include n-type conductors such as indium-tin oxide (ITO), oxides of zinc, tin and lanthanum. In one embodiment, the thickness of the source/drain electrodes may be such that the source/drain electrodes do not hinder or reduce the efficiency of light transmitted through the device.

The material employed in the conducting channel of the thin film transistor may be a zinc oxide-based semiconductor thin film transistor employing zinc-oxide-based nanoparticles. The zinc-oxide-based semiconductor materials are "n-type," although, through the use of suitable dopants, p-type materials are also envisioned. The zinc-oxide-based semiconductor material can contain other metals capable of forming semiconducting oxides such as indium, tin, or cadmium, and combinations thereof. Minor amounts of acceptor dopants can also be included. Semiconductor films described above are capable of exhibiting, in the film form, excellent field-effect electron mobility of greater than 0.01 square centimeter/Volts-Second and on-off ratios of greater than 104, enabling their use in a variety of relevant technologies, including active matrix display backplanes.

Other suitable materials having specific thickness that may be employed in the conducting channel of the thin film transistor. Suitable materials may include metals like Al, Ag, Au, Ba, Ca, In, K, Li, Mg, Mn, Na, Pb, Sr, Sn, Sc, Y, Zn, and Zr. Other suitable materials may include elements of the lanthanide series. Suitable relatively low work function value alloys may include Ag—Mg alloy, Al—Li alloy, In—Mg alloy, Al—Ca alloy, Li—Al alloy, and Ca—Ga alloy. These low work function value cathode materials may be present in the metallic form or as a n-type dopant dispersed in an organic matrix. Other examples may include alkali metal fluorides or alkaline earth fluorides. Other suitable materials may include metal oxides, such as indium-tin oxide, tin oxide, indium oxide, zinc oxide, indium-zinc oxide, zinc indium-tin oxide, and transition metal oxides such as vanadium oxide (V2O5), molybdenum oxide (Mo2O3), and antimony oxide (Sb2O3). In one embodiment, an organic suitable cathode may be fashioned from carbon nanotubes. The cathode can be made of multiple layers to enhance electron injection. Non-limiting examples of multi-layer cathodes may include an inner layer of either LiF or NaF with an outer layer of aluminum or silver; and an inner layer of calcium with by an outer layer of aluminum or silver. The thickness of the conducting channel may be such that the conducting channel does not hinder or reduce the efficiency of light transmitted through the device.

The conducting channel of the transistor may include at least one carbon nanotube network. Additionally, at least one of the remaining three components of the transistor i.e., the source electrode, the drain electrode and the gate electrode, may include at least one carbon nanotube network. A carbon nanotube transistor can be employed where a carbon nanotube network provides the source and drain, the conducting channel and the gate electrode; or a carbon nanotube network used for the source and drain; and a carbon nanotube network used for the conducting channel; or a carbon nanotube network used for the source and drain; and a carbon nanotube network used for the gate; or a carbon nanotube network used for the gate; and a carbon nanotube network used for the conducting channel.

The carbon nanotubes used to make the networks can be undoped, or can be doped for p-type transistors and n-type transistors. The networks may include two differing species, such as carbon nanotubes and polyaniline to provide different conducting properties; the networks with differing densities at different locations on the substrate may be used; the networks can be patterned on the surface to provide some areas that are covered some areas that are not covered. Other nanomaterials may be employed in conjunction with or as a replacement for the carbon nanotubes. Suitable nanomaterials include nano-wires having dimensions less than 900 nanometers in diameter (the diameter is the average of the cross-sectional width) and having an aspect ratio exceeding 10. Suitable nanomaterials may include single element nano-wires made from silicon, from a combination of Group III-V materials, from a combination of Group II-VI, from metal oxides, or from metal chalcogenides Suitable Group III-V materials may include Ga, In, N, P, As and Sb. Suitable Group II-VI materials may include Zn, Cd, Hg, S, So and Te. Suitable metal chalcogenides may include Mn, Fe, Co, Ni, Cu, Ag, Sn, Pb and Bi. Other suitable metal chalcogenides may include metal oxides such as CdO, Ga2O3, In2O3, MnO, NiO, PbO, Sb2O3, SnO2, and ZnO. Other suitable nanomaterials may include conducting polymers polyaniline, polypyrrole, and polythiophene. And, yet other suitable nanomaterials may include metals and alloys.

The display layer may further include a reversibly opacifying layer. The opacifying layer responds to an electrical signal by switching to or from a light transmissive state from or to a light blocking or light absorbing state. The opacifying layer may be disposed on a surface of the display layer opposite to a surface of the display layer that emits light. Suitable examples of opacifying layer may include an electrochromic device, suspended particle device, or liquid crystal device.

Figure 1:
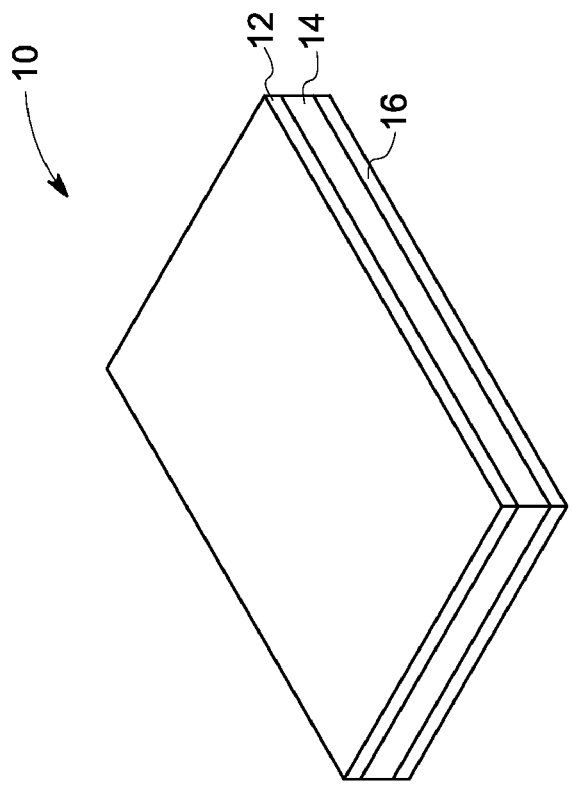
FIG. 1 is a schematic representation of an embodiment of an article according to the invention.

Referring to FIG. 1 and FIG. 2, components 10 and 18 provide two exemplary modes for depositing thermal transport layers i.e., heat flux removal layers on a display layer for a video display system used in a video game. In the video display system of FIG. 1 a thermal transport layer 14 is sandwiched in-between two display layers 12 and 16 of the video game. In the video display system of FIG. 2 the display layer 22 of the video game is sandwiched in-between two thermal transport layers 20 and 24.

Figure 3:
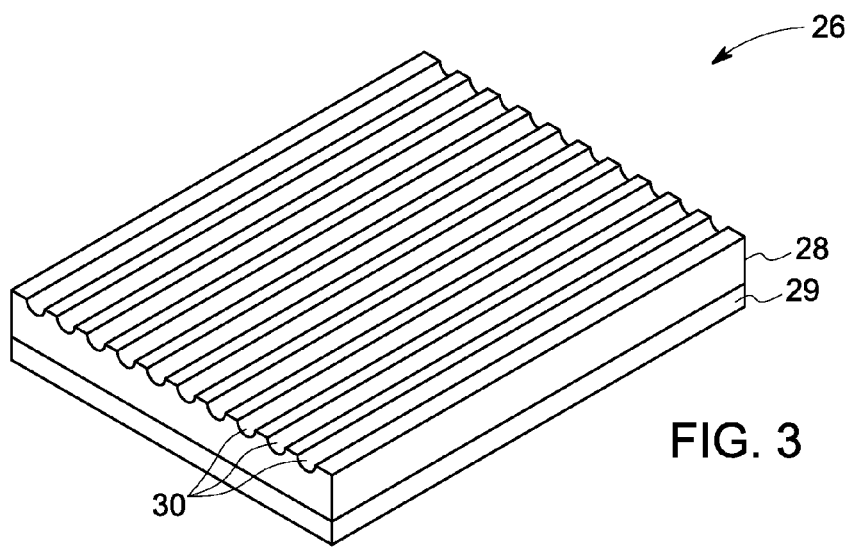
FIG. 3 is a schematic representation of an embodiment of an article according to the invention.

Referring to FIG. 3, component 26 of a medical imaging system video display unit has a thermal transport layer 28 secured to a display layer 29. The thermal transport layer has a surface that defines microfluidic channels 30 with a semi circular cross-section. These channels are filled with aqueous fluid during use that is RI matched to the thermal transport layer. The RI of the system is about 1.1. The aqueous fluid is passed through the channels under a pressure of about 10 psi. These channels were formed by laser ablation of the thermal transport layer, which is made of polycarbonate which is a laser ablatable polymeric material. The channels traverse about 80 percent of the surface of the display layer.

Figure 4:
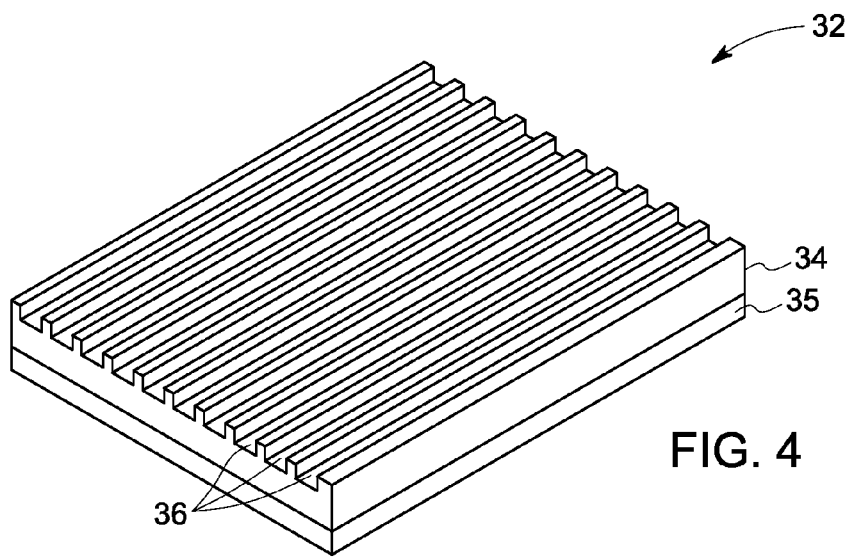
FIG. 4 is a schematic representation of an embodiment of an article according to the invention.

Referring to FIG. 4, component 32 of a medical imaging system video display unit has a thermal transport layer 34 secured to a display layer 35 that defines microfluidic channels 36 with a square cross-section. These channel were formed by a dry etch process using a mask over the thermal transport layer. The thermal transport layer responds to reactive ion etching over the mask by forming the channels.

Figure 5:
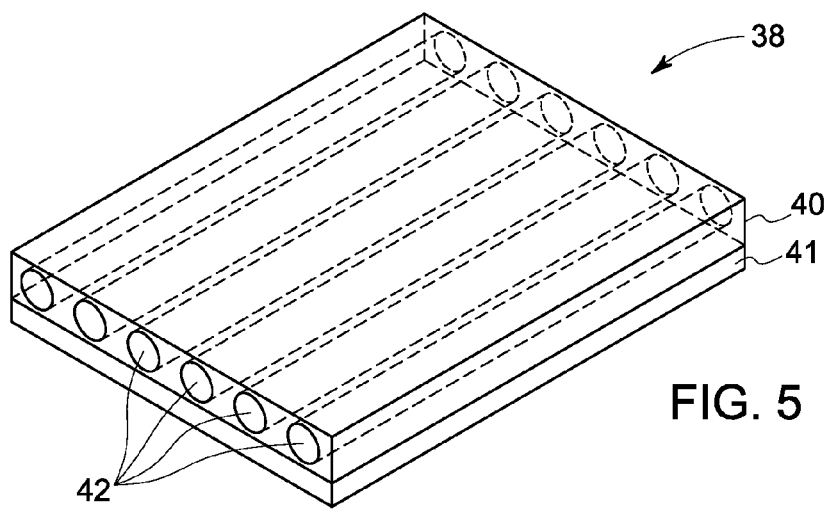
FIG. 5 is a schematic representation of an embodiment of an article according to the invention.
Figure 6:
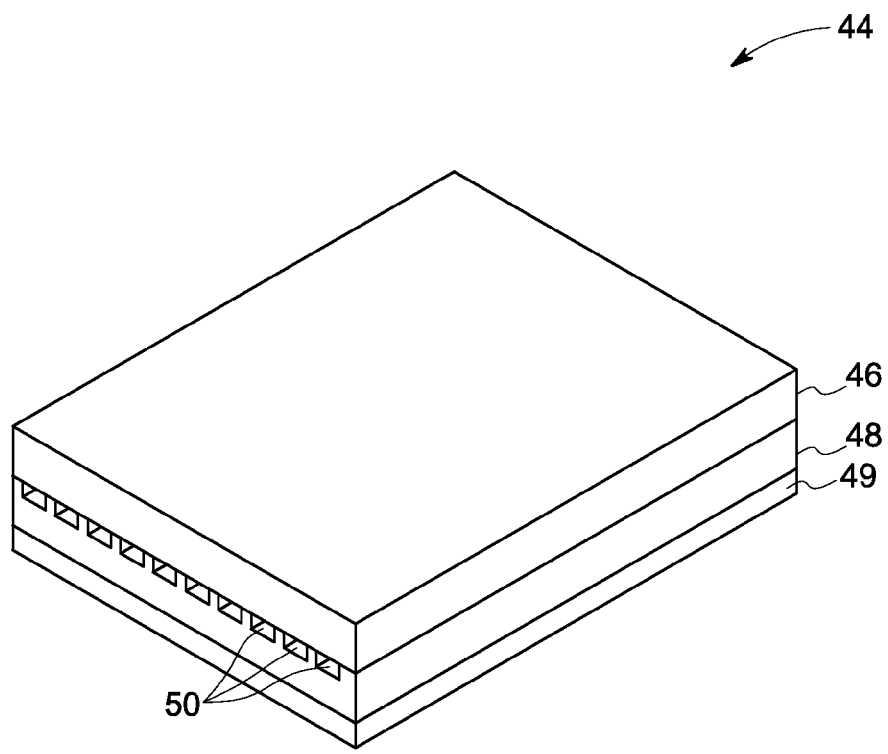
FIG. 6 is a schematic representation of an embodiment of an article according to the invention.
Figure 7:
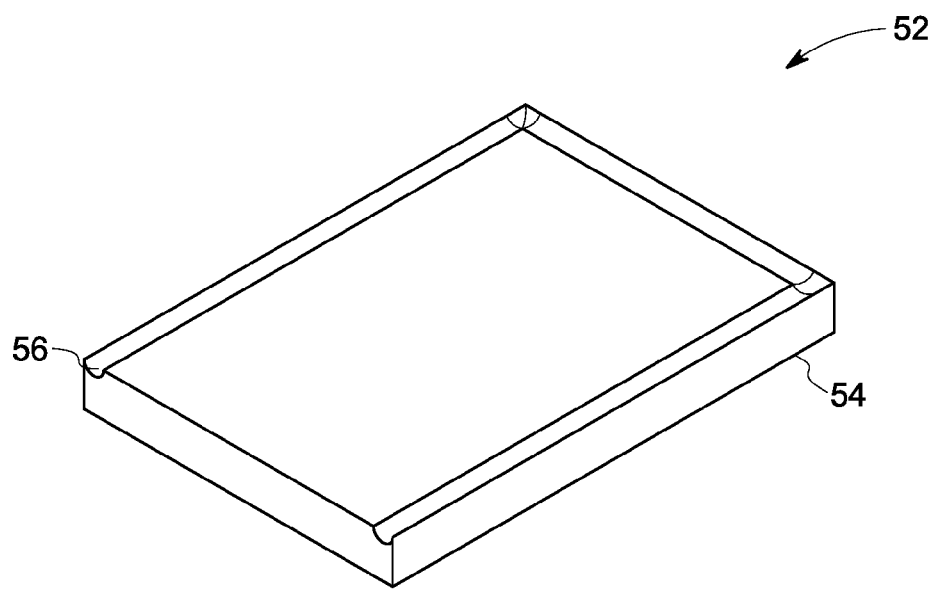
FIG. 7 is a schematic representation of an embodiment of an article according to the invention.

Referring to FIG. 5, component 38 of a video game system provides a thermal transport layer 40 formed on a display layer 41, having microfluidic channels 42 like tubes running through the display layer. Referring to FIG. 6, an article 44 provides a thermal transport layer 48 formed on a display layer 49 having microfluidic channels 50. A display layer 46 is disposed on the thermal transport layer forming microfluidic channels bound on all four sides. Referring to FIG. 7, component 52 of a medical imaging system video display unit provides a display layer 54 having a microfluidic channel 56 running around the periphery of the display layer.

Figure 8:
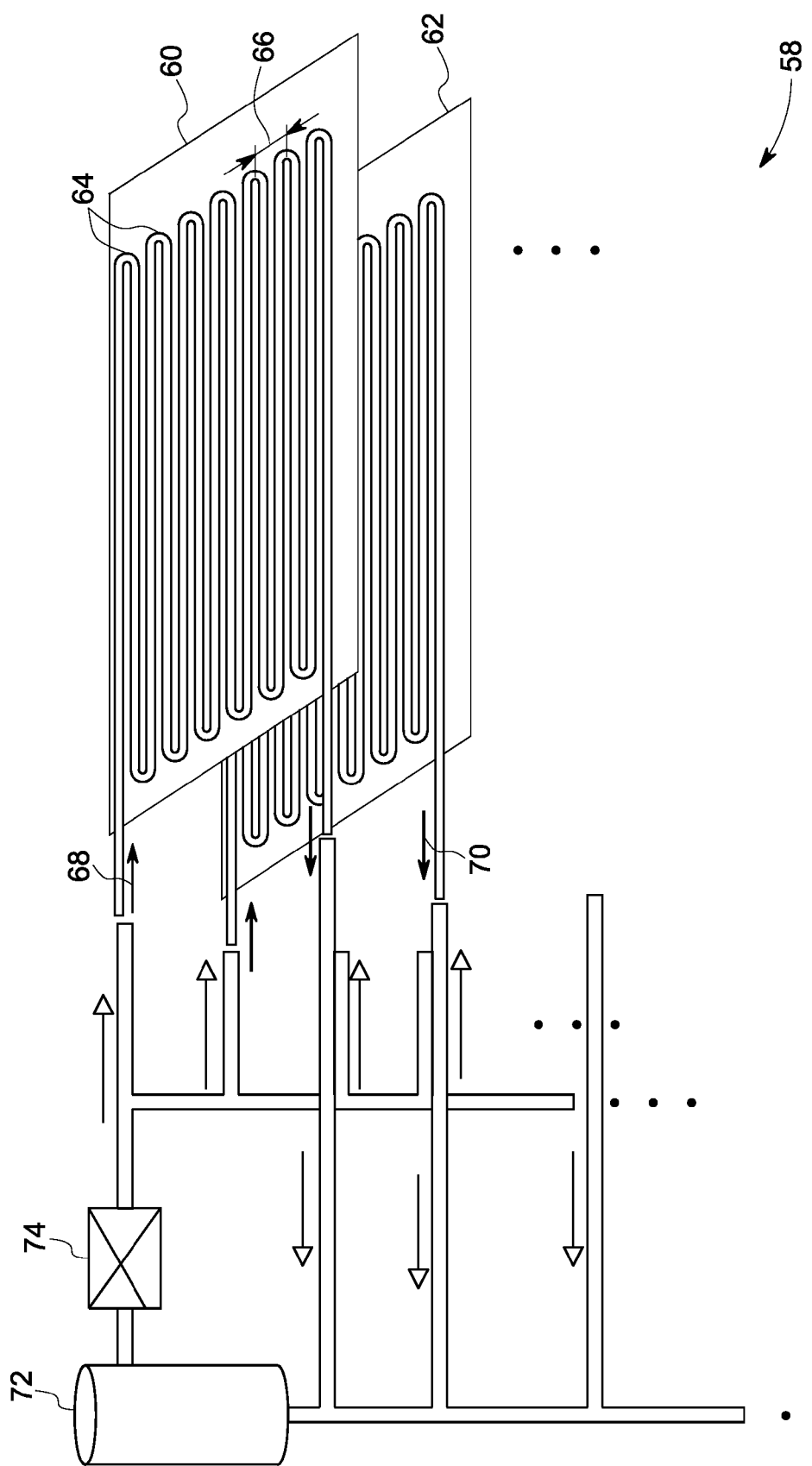
FIG. 8 is a schematic representation of an embodiment of an article according to the invention.

Referring to FIG. 8, the components 58 of a bill-board video display unit includes microfluidic channels 64 disposed on display layers 60 and 62. A cooled coolant (water) is circulated through the channels. The cooled coolant held in a reservoir 72 is pumped into the microfluidic channels using a pump 74 as indicated by the arrow 68. The warmed coolant, after absorbing the heat from the display layer, coming out of the channel as indicated by arrow 70, may be passed through a heat exchanger (not shown in figure). The resultant cooled coolant may be circulated back to the channels. The microfluidic channels loop back 64 as they traverse the surface defined by the display layer. The pitch of the channels from one loop to another loop is indicated by 66.

Figure 9:
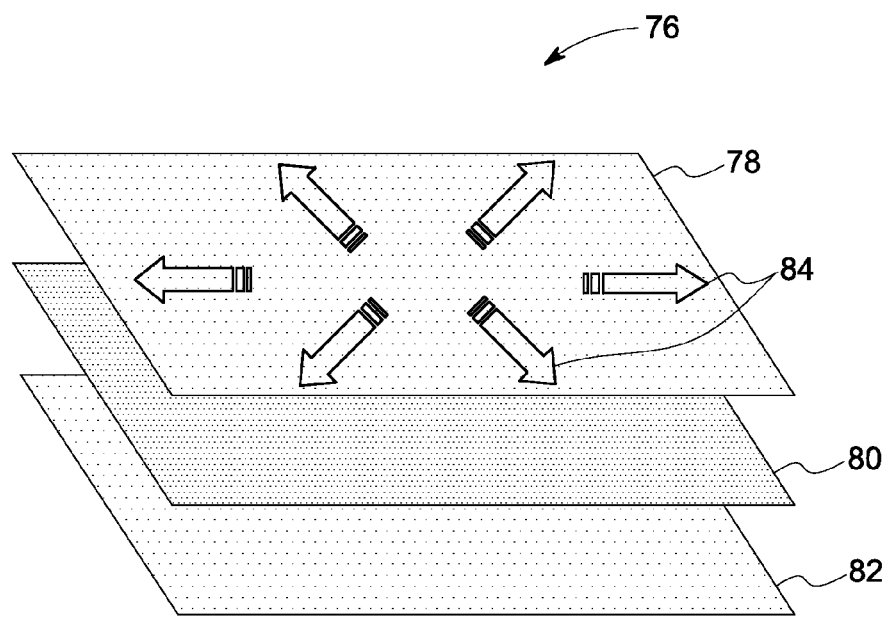
FIG. 9 is a schematic representation of an embodiment of an article according to the invention.
Figure 10:
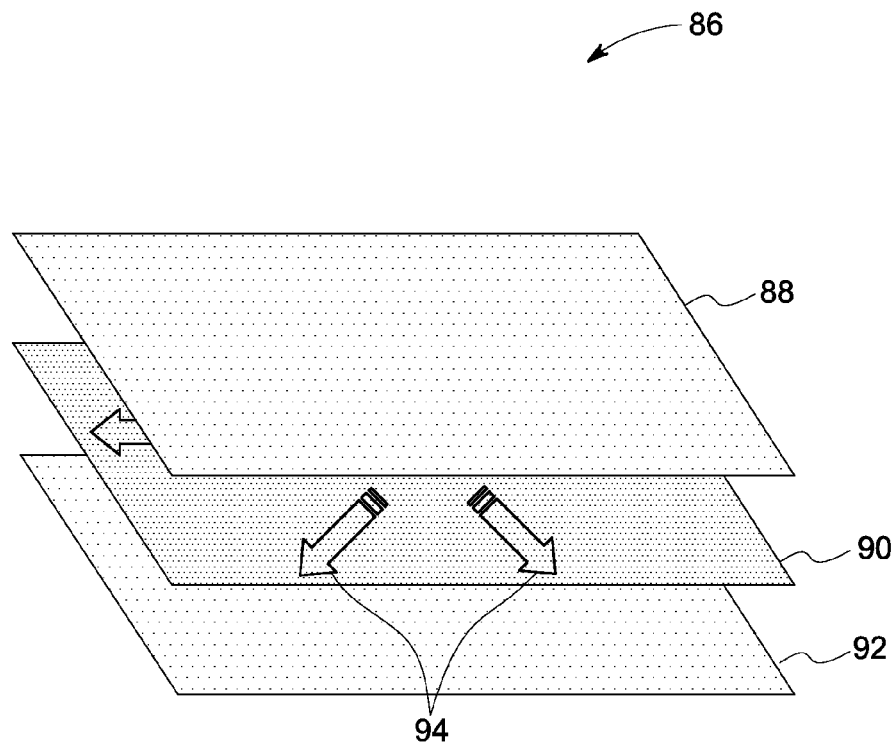
FIG. 10 is a schematic representation of an embodiment of an article according to the invention.

Referring to FIG. 9 and FIG. 10, components 76 and 86 of a medical imaging system video display unit include two exemplary modes of depositing a thermal transport layer e.g., diamond CVD or an ITO layer on a display layer. In the component of FIG. 9 the display layer 80 is sandwiched in-between the two thermal transport layers 78 and 82. The heat generated by the display layer is spread over the thermal transport layer in the directions indicated by arrows 84. In the component of FIG. 10 the thermal transport layer 90 is sandwiched in-between the two display layers 88 and 92. The heat generated by the display layer is spread over the thermal transport layer in the directions indicated by arrows 94.

Figure 11:
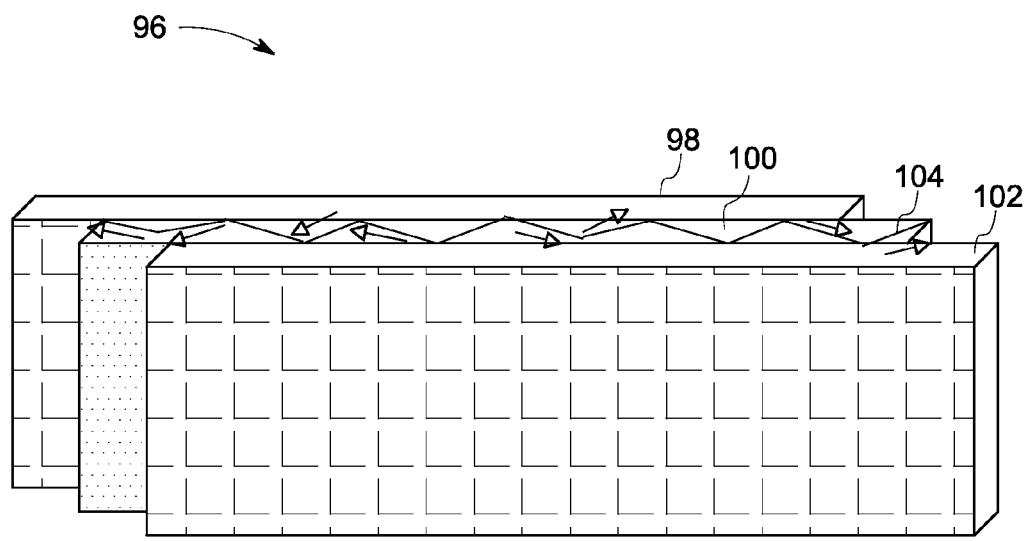
FIG. 11 is a schematic representation of an embodiment of an article according to the invention.
Figure 12:
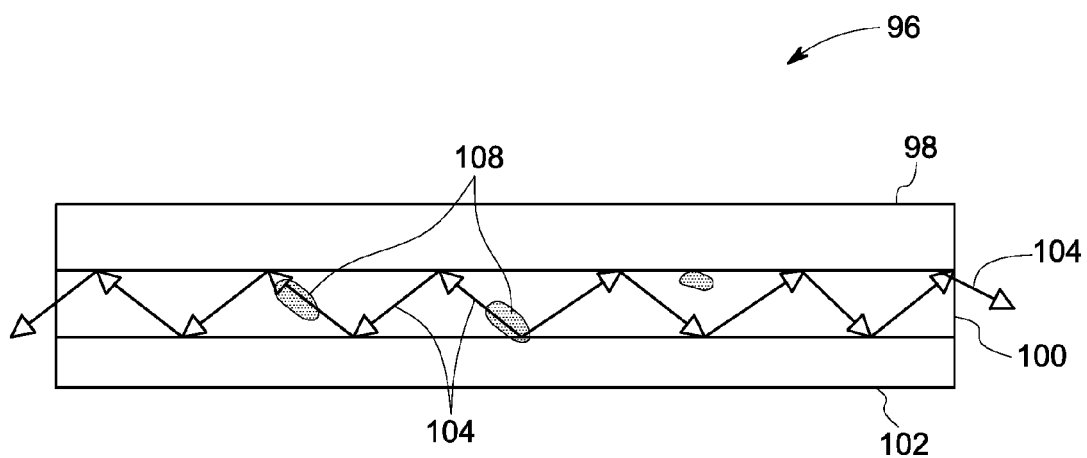
FIG. 12 is a schematic representation of an embodiment of an article according to the invention.

Referring to FIG. 11, the component 96 of a bill board video display unit provides a stack of display layers including a display layer having high-shear modulus 100 sandwiched between two display layers having low-shear modulus 98 and 102. Localized heat-source-induced guided elastic Lamb and Love waves 104 propagate along the acoustic waveguide plane in the display layer having a higher shear modulus. Referring to FIG. 12, a top-view of the component 96 shows localized heat spots 106 which induce the guided elastic Lamb and Love waves. The elastic Lamb and Love waves are shown as propagating through the display layer having high-shear modulus.

Figure 13:
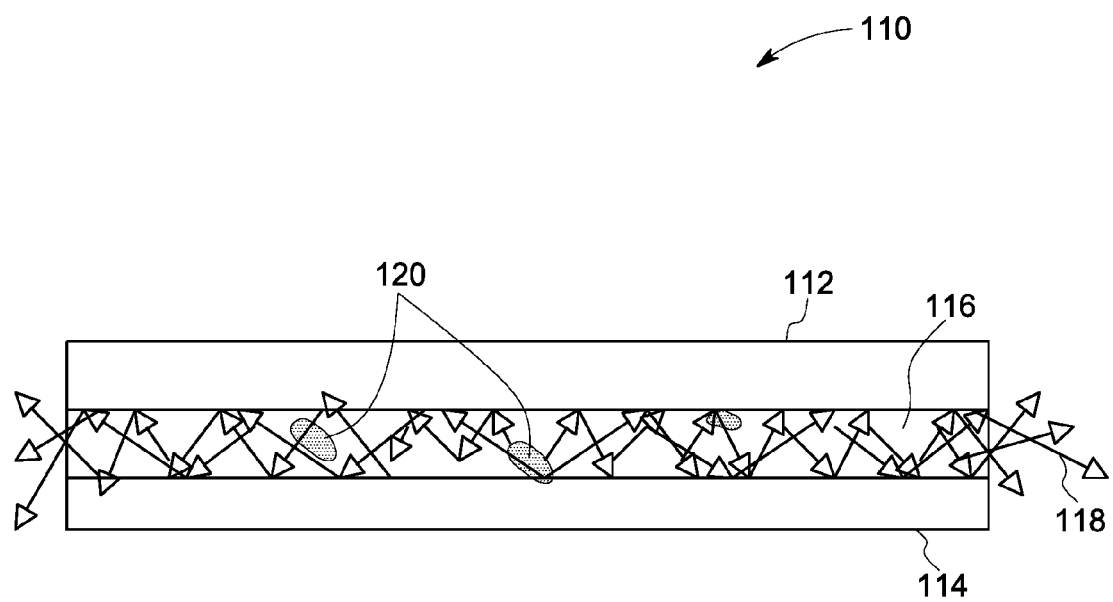
FIG. 13 is a schematic representation of an embodiment of an article according to the invention.

Referring to FIG. 13, the component 108 of a video game video display system includes a display layer 114 having a high refractive index sandwiched between display layers 110 and 112 having lower refractive indices. The two low-refractive-index layers will guide the localized heat spots 118 produced short- and long-wavelength light 116 through the high-refractive display layer to outside the video display system via zigzag paths.

Figure 14:
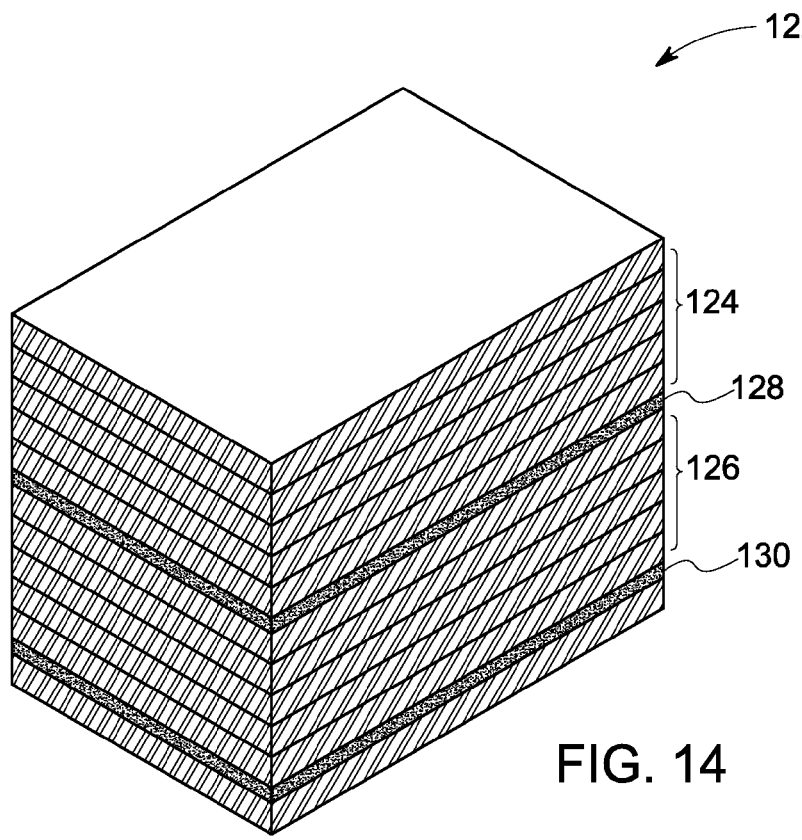
FIG. 14 is a schematic representation of an embodiment of an article according to the invention.

Referring to FIG. 14, an article 120 includes thermal transport layers 126 and 128 placed after each set of 5 display layers 122 and 124. The set of 5 display layers may include red, green or blue color OLEDs secured on the layers, and interspaced with an electrochromic, photochromic or thermochromic layers.

Figure 15:
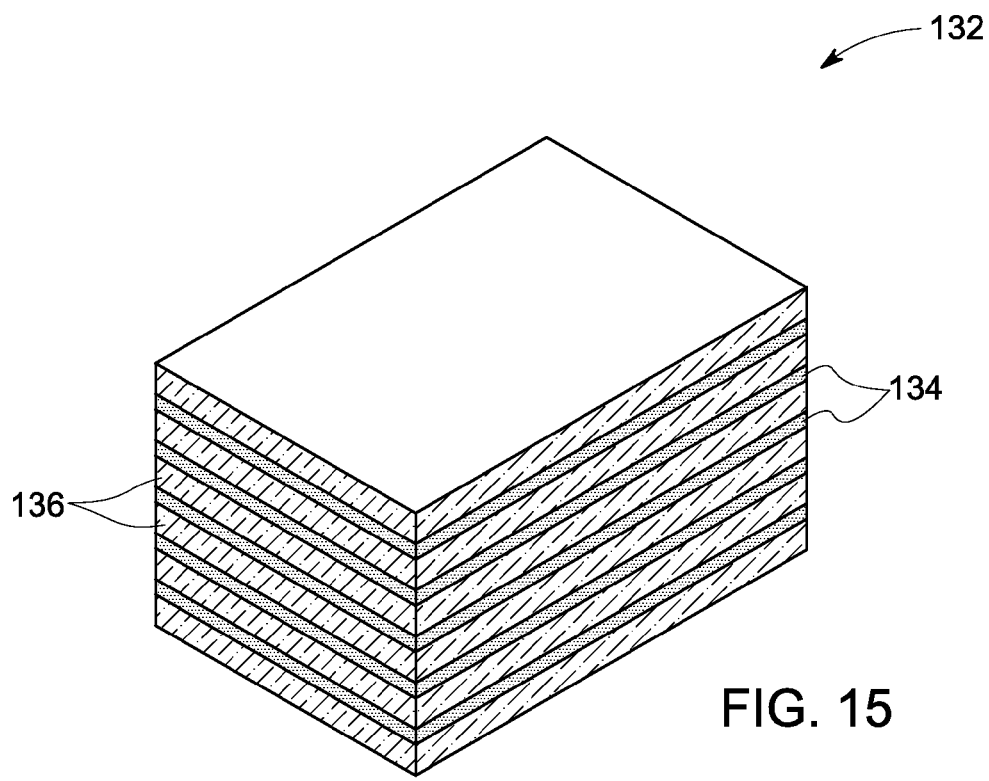
FIG. 15 is a schematic representation of an embodiment of an article according to the invention.
Figure 16:
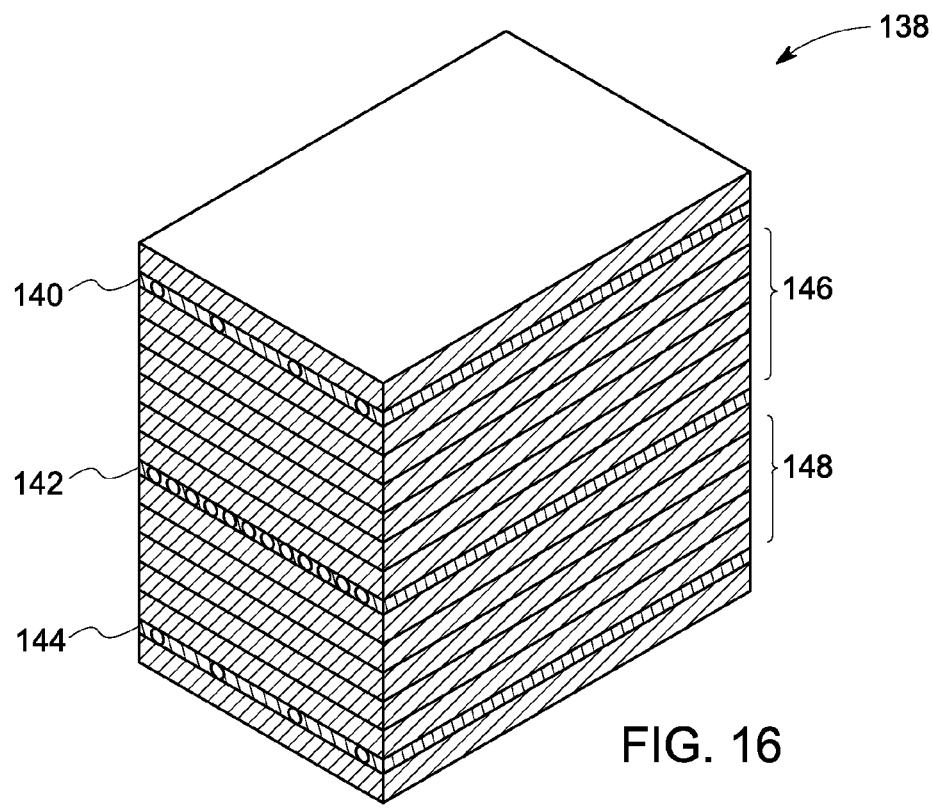
FIG. 16 is a schematic representation of an embodiment of an article according to the invention.

Referring to FIG. 15, the component 130 of a medical imaging system video display unit includes thermal transport layers 132 placed after each display layer 134. Referring to FIG. 16, the component 136 of a medical imaging system video display unit includes thermal transport layers 138 and 142 having a lower density of microfluidic channels and thermal transport layer 140 having a higher density of microfluidic channels. The thermal transport layers having low density of microfluidic channels are placed towards the outer surface of the display stack defined by display layers 144 and 146. The thermal transport layer having a higher density of microfluidic channels is placed towards the middle of the display stack.

Figure 17:
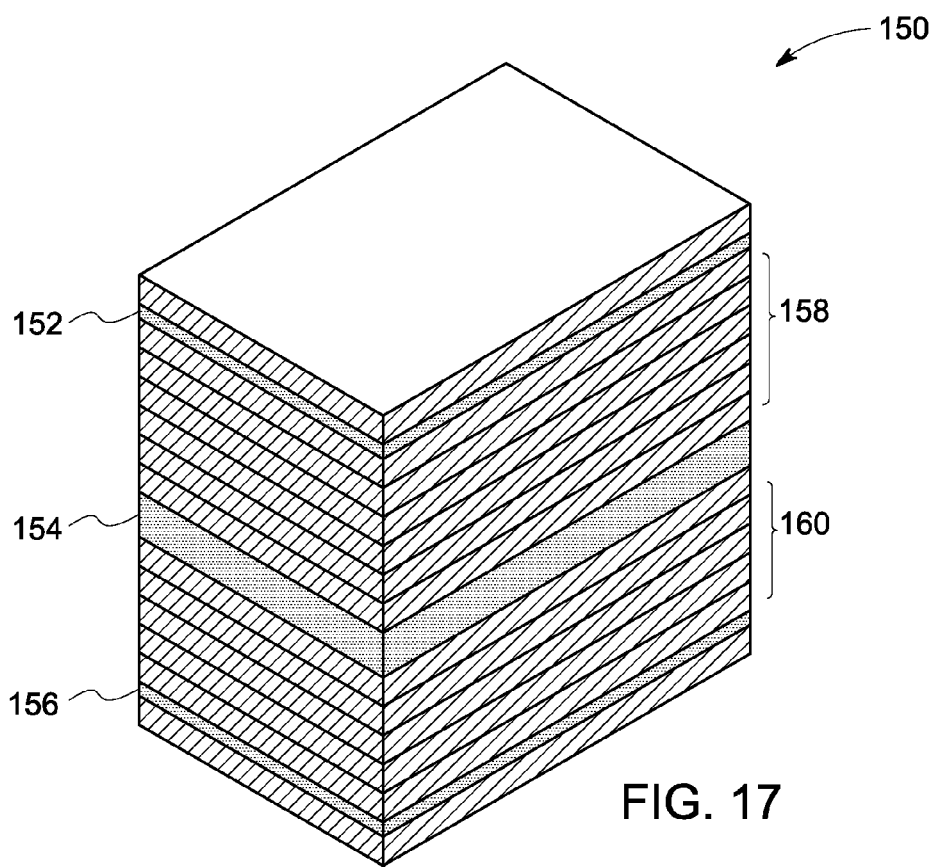
FIG. 17 is a schematic representation of an embodiment of an article according to the invention.
Figure 18:
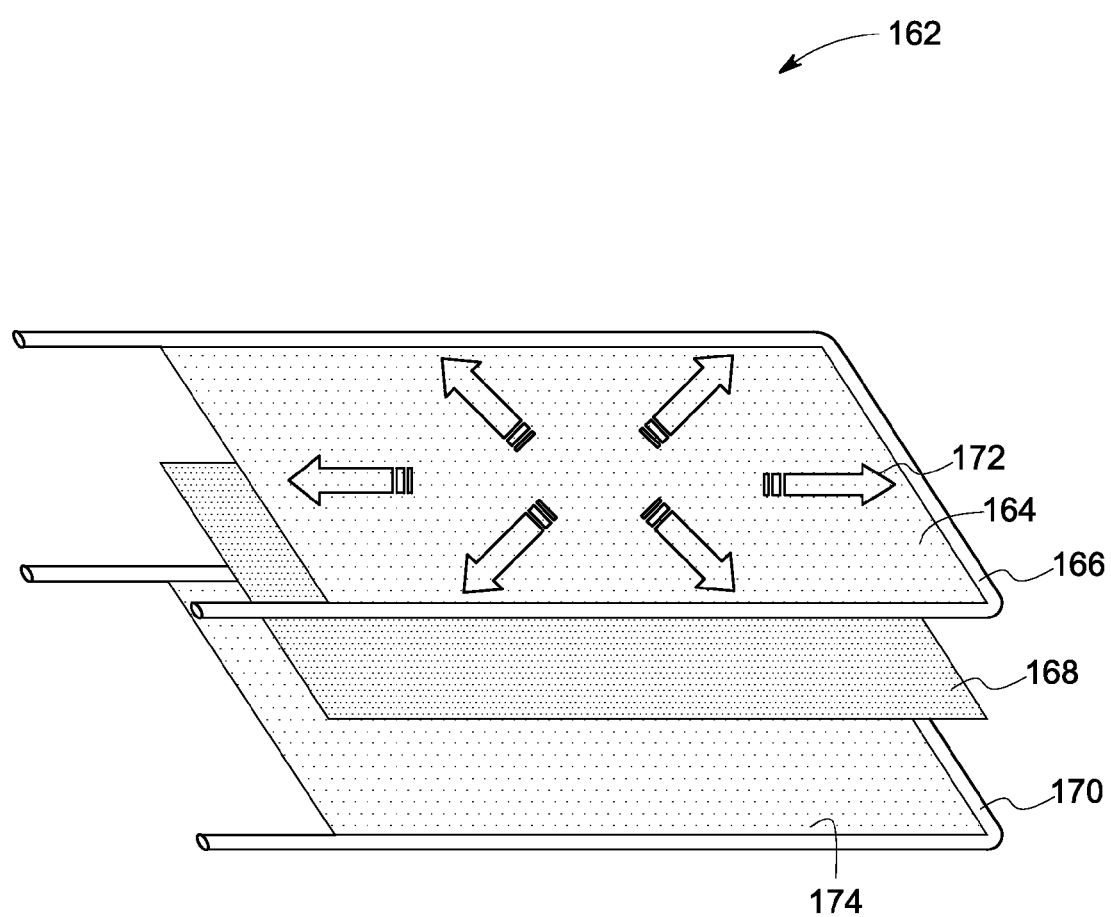
FIG. 18 is a schematic representation of an embodiment of an article according to the invention.

Referring to FIG. 17, the component 148 of a medical imaging system video display unit includes thermal transport layers 150 and 154 having a lower layer thickness and thermal transport layer 152 having a higher layer thickness. The thermal transport layers having lower thickness are placed towards the outer surface of the display stack defined by display layers 156 and 158. The thermal transport layer having a higher thickness is placed towards the middle of the display stack Referring to FIG. 18, the component 160 of a video game video display system provides a display layer 166 sandwiched between thermal transport layers 162 and 172. The arrows 170 indicate the directions in which heat is spread across the surface of the thermal transport layer. The heat dissipating structures 164 and 168 running around the periphery of the thermal transport layer assist in carrying the heat absorbed from the thermal transport layer from the display layer away from the thermal transport layer.

Figure 19:
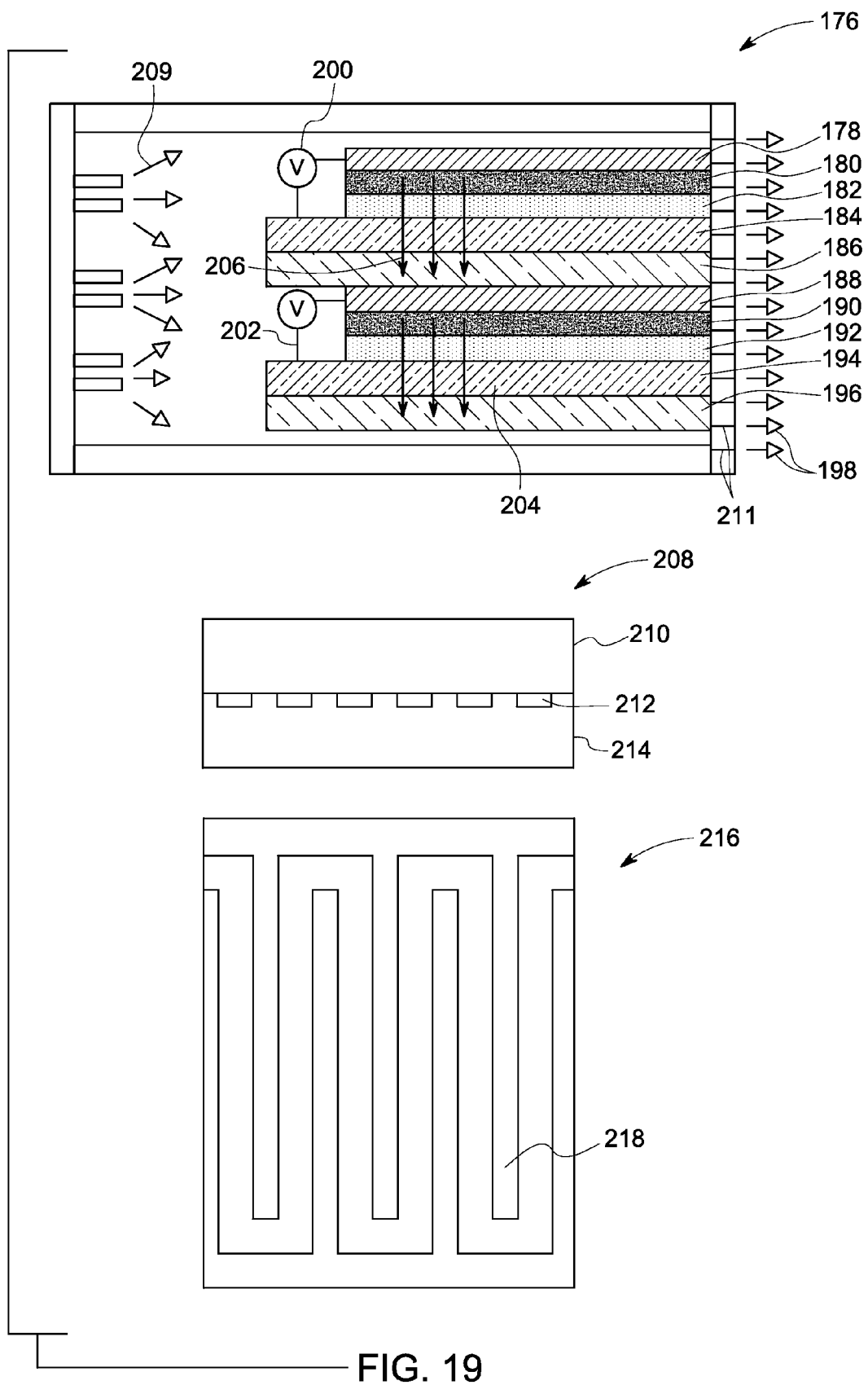
FIG. 19 is a schematic representation of an embodiment of an article according to the invention.

Referring to FIG. 19, the component of a bill board video display unit 174 provides an organic light-emitting device having a first cathode 176, first set of electrochromic layers providing a red colored organic light-emitting device 178 and 180, a first anode 182, a transparent substrate 184, a second cathode 186, second set of electrochromic layers providing a green colored organic light-emitting device 188 and 190, a second anode 192, and a second substrate 194. The light emitted from the organic light-emitting devices 204 and 206 may be tuned using external tunable voltage sources 198 and 202. Referring to the side view 208 of the component, microfluidic channels 212 formed on a thermal transport layer 214 are secured to the inward surface of display layer 210 which includes the organic light-emitting devices. Referring to the top-view 216 of the component, microfluidic channels 218 are formed on the surface of the display layer. The organic light-emitting device is in thermal communication with a synthetic jet actuator having jets of air 207 flowing over the organic light-emitting device may result in taking away the heat from the thermal transport layer when the jets of air 196 exit from the nozzles 200. This component uses a combination of a thermal transport layer and a heat dissipating structure to remove heat away from the display layer.

Figure 20:
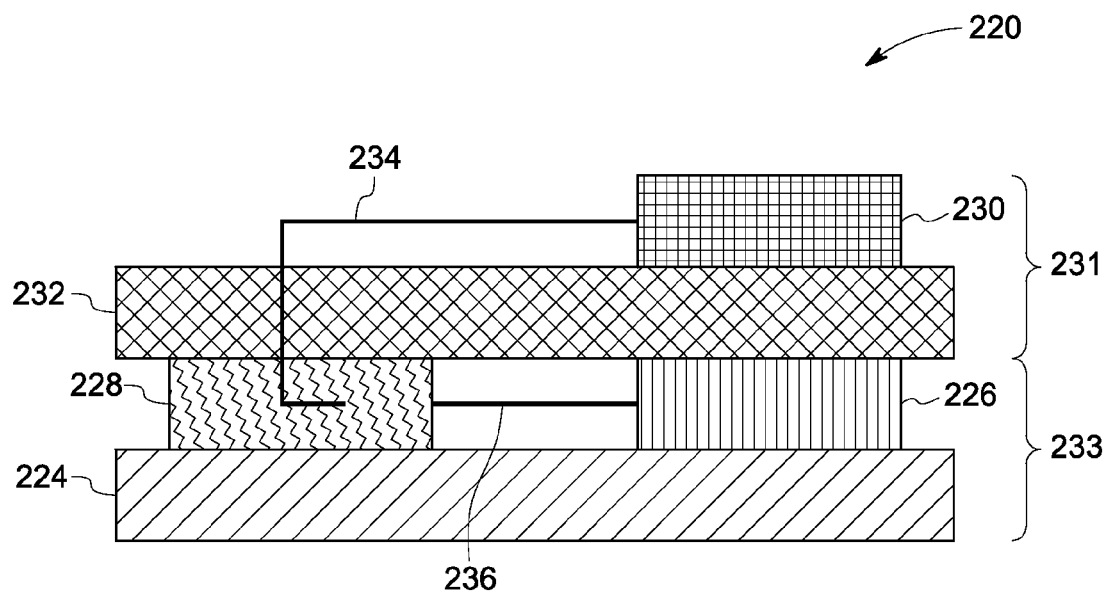
FIG. 20 is a schematic representation of a light-emitting device.

Referring to FIG. 20, a light-emitting device 220 includes a controller 226 and a first organic electronic device 224. Both secure to a substrate 222 to form a first layer 236 of the device. A second substrate 230 is disposed over the first layer of the device, and a second organic electronic device 228 is secured to the second substrate to form a second layer 235. The controller connects to both the first organic electronic device and the second organic electronic device. The controller can control the first organic electronic device and the second organic electronic device by varying an applied voltage bias 232 and 234, respectively.

Figure 21:
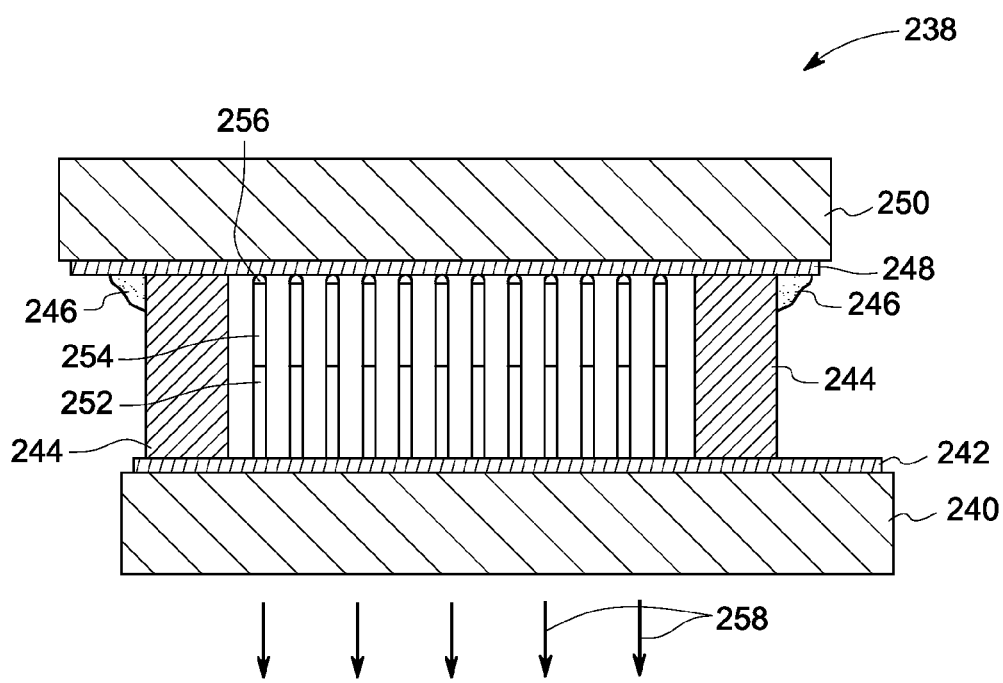
FIG. 21 is a cross-sectional view of an embodiment of a light-emitting nano-wire device.

Referring to FIG. 21, a light-emitting nano-wire device 238, has an electrically conductive element made of a light transmissive substrate 240 coated with a conductive element 242. The conductive element is then plated with an insulation layer (not shown in figure). Then a light resistant layer (not shown in figure) is coated on the surface of the insulation layer. Then an exposure and development zone (not shown in figure) is formed on the light resistant layer and this is removed by etching to form an etching zone (not shown in figure). A part of the insulation layer remains after the formation of the etching zone and this part serves as the insulation layer support post 244 between the electrically conductive element and the cover substrate 250. Then the electrically conductive element is coated with a metal catalyst (aurum, Au) 256 and is heated at about 650 degrees centigrade, so that the metal catalyst may form a nano Au point. Then the light resistant layer is removed and the electrically conductive element coated with the metal catalyst layer is placed in a furnace to grow the nano-wires by the VLS method, to form an N-type semiconductor nano-wire 252 and a P-type semiconductor nano-wire 254 thereby forming a light-emitting nano-wire with a P-N interface. Then, the cover substrate having an inner surface coated with an eutectic alloy layer 248 is disposed on the electrically conductive element having the growing nano-wires, and each of the cover substrate and the electrically conductive element may be pre-provided with connecting terminals. The cover substrate may be heated, so that the eutectic alloy material on the inner face of the cover substrate may be bonded with the metal catalyst on the top of the nano-wires. Then, a bonding glue 246 may be coated on the connection of the cover substrate and the electrically conductive element, which may help prevent water from infiltrating into the elements. Then, the power is turned on, so that the light 258 may be emitted from the surface of the electrically conductive element.

Figure 22:
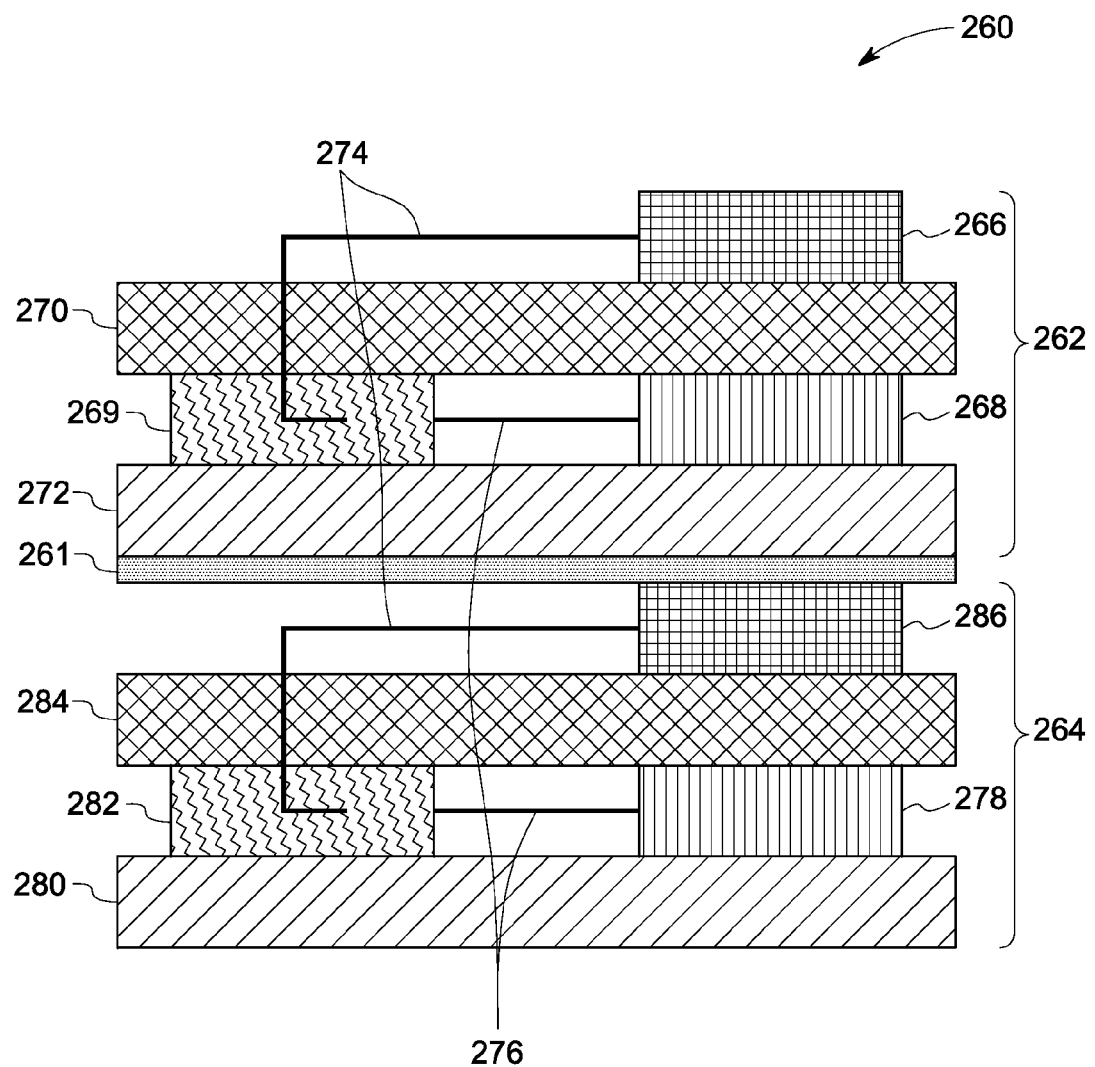
FIG. 22 is a schematic representation of an embodiment of an article according to the invention.

Referring to FIG. 22, two of the light-emitting devices as shown in FIG. 20, are overlaid and stacked together to form a light-emitting device 260. The light-emitting devices may be part of the video display unit of a medical imaging system. The first stack device 262 and the second stack device 264 each include a controller 269 and 282, an organic electronic devices 278, 286, 268 and 266 that are secured to the respective substrates 280, 284, 272 and 270. The substrate in this embodiment may be an unreinforced, flexible thermoplastic sheet having a thickness of about 0.25 millimeters, and a transparency or light transmission of greater than 85 percent at 550 nanometers wavelength. The organic electronic device in the first stack device is red. In the first stack device and second stack device, the controller connects to both the first organic electronic device and the second organic electronic device and controls both the organic electronic devices by varying the applied voltage bias 274 and 276. The organic electronic device in the second stack device is blue, and has a green phosphor operably coupled thereto. The first organic electronic device and the second organic electronic device may emit light at different wavelengths. For example, the first organic electronic device may be a blue light-emitting diode and the second organic electronic device may be a red light-emitting diode. Alternately, a different combination of organic electronic device, each of which emit light at different wavelengths, may be used. The perceived color of the light emerging from the article is a combination of the unmodulated light emerging directly from the article and the modulated light, the modulated light being modulated by the controller. A CVD diamond layer 261 may be disposed between the first stack and the second stack device.

Figure 23:
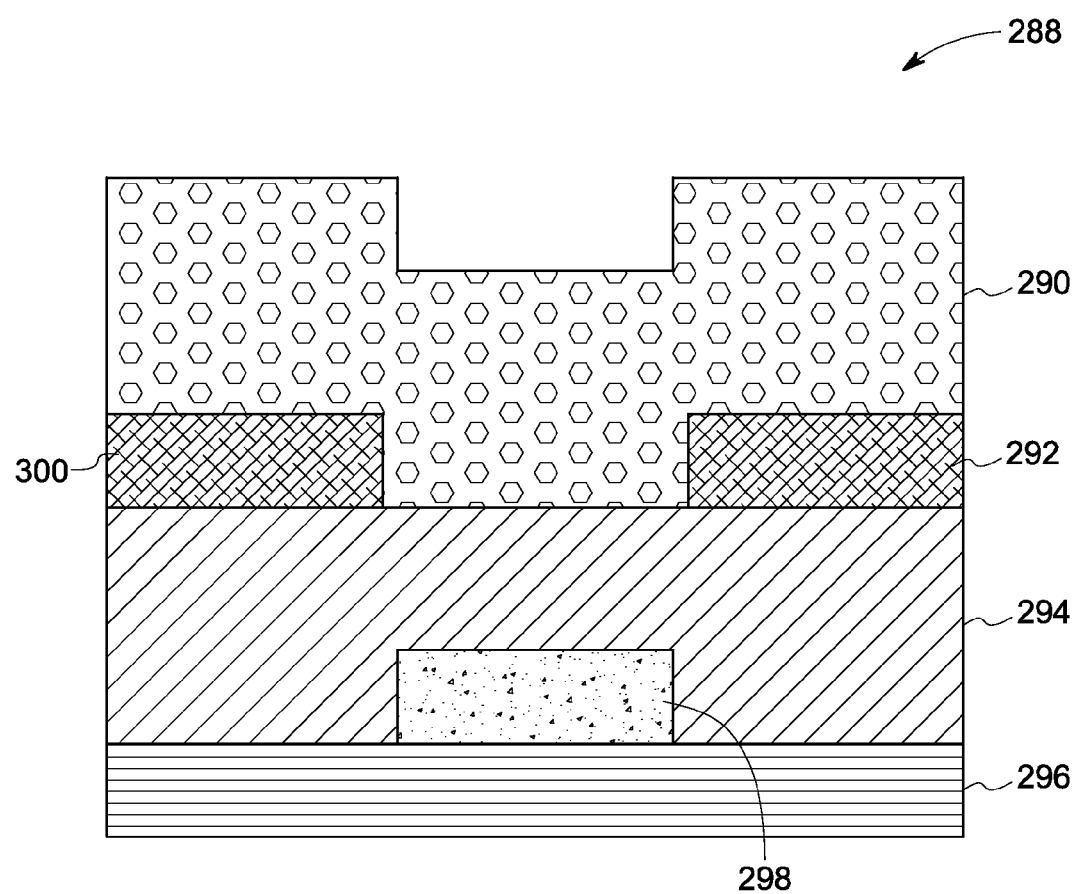
FIG. 23 is a cross-sectional view of a thin film transistor having a bottom-gate/bottom-contact configuration.

Referring to FIG. 23, the controller 288, includes a source electrode 300, a drain electrode 292, a gate electrode 298, a gate dielectric 294, a substrate 296, and the conducting channel 290 used in the invention in the form of a film connecting the source electrode to drain electrode. When the controller operates in an enhancement-mode, the charges injected from the source electrode into the semiconductor are mobile and a current flows from source to drain electrode, mainly in a thin channel region within 100 Angstroms of the conduction channel-gate dielectric interface. In this configuration, the charge may be injected laterally from the source electrode to form the conducting channel. In the absence of a gate field the conducting channel has few charge carriers; as a result there is ideally no source-drain conduction when the device is in off mode. The off current is defined as the current flowing between the source electrode and the drain electrode when charge has not been intentionally injected into the conducting channel by the application of a gate voltage. This occurs for a gate-source voltage that is more negative, assuming an n-channel, than a certain voltage known as the threshold voltage. The on current is defined as the current flowing between the source electrode and the drain electrode when charge carriers have been accumulated intentionally in the channel by application of an appropriate voltage to the gate electrode, and the conducting channel is conducting. For an n-channel accumulation-mode controller, this occurs at gate-source voltage more positive than the threshold voltage. It is desirable for this threshold voltage to be zero, or slightly positive, for n-channel operation. Switching between on and off is accomplished by the application and removal of an electric field from the gate electrode across the gate dielectric to the conducting channel-gate dielectric interface, effectively charging a capacitor.

Figure 24:
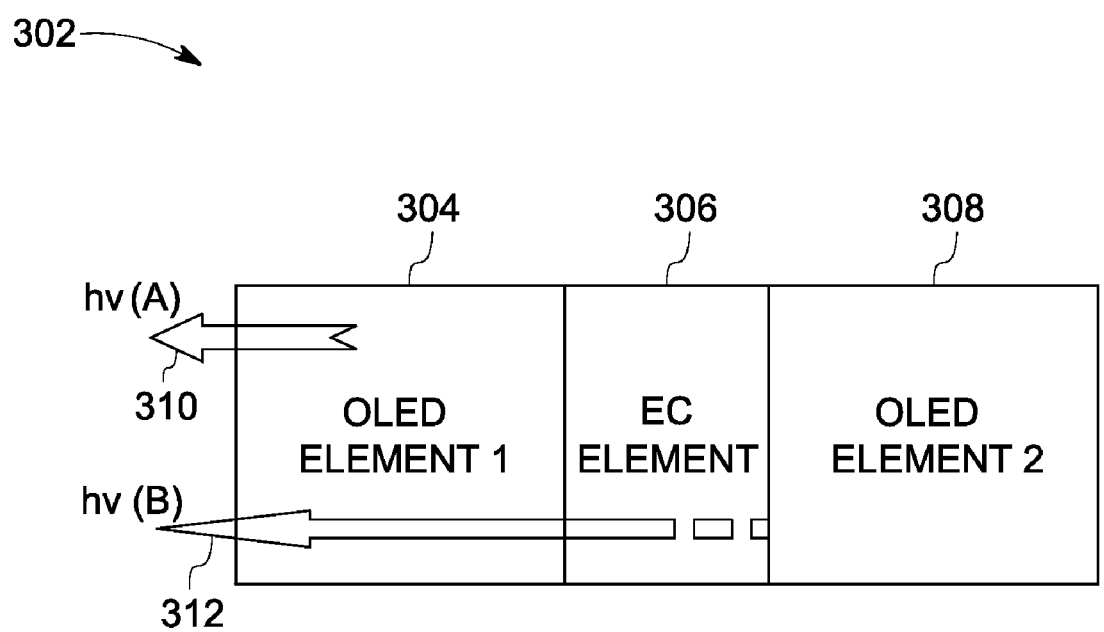
FIG. 24 is a schematic representation of the change in color emitted from a color-tunable light-emitting device.

Referring to FIG. 24, the color-tunable light-emitting device 302 includes a first OLED 304 and a second OLED 308 emitting light at different wavelengths. In one embodiment the first OLED may be a blue light-emitting OLED and the second OLED may be a red light-emitting OLED. Alternately, a different combination of OLED that emits light at different wavelengths may be used. For example the first OLED may be a red light-emitting OLED and the second OLED may be a blue light-emitting OLED. The transmission properties of the electrochromic EC element 306 can be tuned by varying an applied voltage bias. The perceived color of the light emerging from the device is thus a combination of the unmodulated light 310 emerging directly from the device and the modulated light 312, said modulated light being modulated by the electrochromic element. In one embodiment, the electrochromic element is substituted with a photochromic element. Where a photochromic element is used, the photochromic element can be tuned by coupling with a light tunable source. In one embodiment, the electrochromic element is replaced with a thermochromic element. When a thermochromic element is used the thermochromic element can be tuned by coupling with a temperature tunable source.

Referring to FIG. 25, the color-tunable light-emitting device 314 includes an OLED 316, an active light transformative element, here an electrochromic element 318, a passive light transformative element, here a red phosphor layer 320, and a reflective element, here a mirror 322. The transmission properties of the electrochromic element can be tuned by varying an applied voltage bias. The perceived color is thus a combination of the unmodulated light 324 emerging directly from the device and modulated light 326, said modulated light being modulated by one or more of the light transformative elements. In one embodiment, the electrochromic element is replaced with a photochromic element. When a photochromic element is used the photochromic element can be tuned by coupling with a tunable light source. In yet another embodiment, the electrochromic element is replaced with a thermochromic element. When a thermochromic element is used the thermochromic element can be tuned by coupling with a temperature tunable source.

Referring to FIG. 26 the color-tunable light-emitting device 328 includes an OLED 330, an active light transformative element which is an electrochromic element 332, and a passive light transformative element, here a red phosphor 334; the transmission of the electrochromic element can be tuned by varying an applied voltage bias. The perceived color is thus a combination of the unmodulated light 336 emerging directly from the device and modulated light 338, said modulated light being modulated by one or more of the light transformative elements.

The reflective elements that can be employed in certain embodiments include but are not limited to mirrors and aluminum film. Mirrors may include highly reflective metallic foils, or a metal film on a glass or a plastic substrate.

An article is provided in another embodiment of the invention. The article includes a display structure having a height, a width, and a thickness that define a volume. The display structure can include components that emit light to generate a three-dimensional image within the volume. The display structure includes a stack. The display structure also includes a thermal dissipation layer in contact with the sheet or stack that can transport generated heat from the sheet or stack to a heat absorbing structure. The stack includes at least one layer. The layer includes a substrate, the components that emit light, and a controller. The components that emit light may each be secured to the substrate. The controller may be secured to the substrate. The controller may control the components that emit light to generate a three-dimensional image within the volume. The components that emit light may include organic electronic devices. The controller may be connected to two or more of the organic electronic devices. The components that emit light may include a light-emitting nano-wire device.

The thermal dissipation layers primarily function as the thermal transport layer that carry away the heat generated by the display layers in the sheet or stack. In one embodiment, the thermal dissipation layers includes one or more of the thermal transport layers discussed above including the microfluidic layer, the organic thermal transport layer, the inorganic thermal transport layer, the heat dissipative acoustic waveguide, and a light waveguide.

In one embodiment, the thermal dissipation layer may be in further communication with a heat absorbing structure. Suitable heat absorbing structures include a heat exchanger, a heat spreader, a heat sink, a radiator, one or more Peltier devices, a heat pipe, and an integrated synthetic air-jet module. In various embodiments, the thermal dissipation layer may be in thermal communication with the heat absorbing structure via a highly thermally conductive material such as metalized sheets, conductive glass coating, and porous structural carbon films.

In one embodiment, the layer is a first layer of a plurality of layers, and the plurality of layers includes a second layer that includes one or more components capable of emitting light. In one embodiment, the spatial arrangement of the first layer relative to both the second layer and to a viewer is such that the three-dimensional image can be created for view by a viewer. In one embodiment, the light emitted from the first layer has a different wavelength than the light emitted from the second layer. In certain embodiments, the layers are so arranged that the layer that is farthest from the viewer emits light having a wavelength that is more transmissive through a layer that is relatively nearer the viewer, and the layer that is relatively nearer the viewer emits light having a wavelength that is relatively less transmissive than the layer that is further from the viewer.

In one embodiment, the first layer may be in optical communication with a non-OLED light source that can drive light through the stack to the viewer. In one embodiment, the non-OLED light source may be supported on a support substrate that may be opaque. Suitable support substrates may be retroreflective or mirrored.

In one embodiment, the arrangement of controllers from layer to layer is such that the controllers are offset relative to each other so the light does not have to travel through the controller. In one embodiment, the stack is one of a plurality of similar stacks. In various embodiments, each of the plurality of stacks includes a red OLED, a green OLED, or a blue OLED. In one embodiment, the article may have a pixel density of 10 pixels per square centimeter or 50 pixels per square centimeter, or 100 pixels per square centimeter. In one embodiment, the article may have a voxel density of 100 voxels per cubic centimeter or 500 voxels per cubic centimeter, or 1000 voxels per cubic centimeter.

Figure 27:
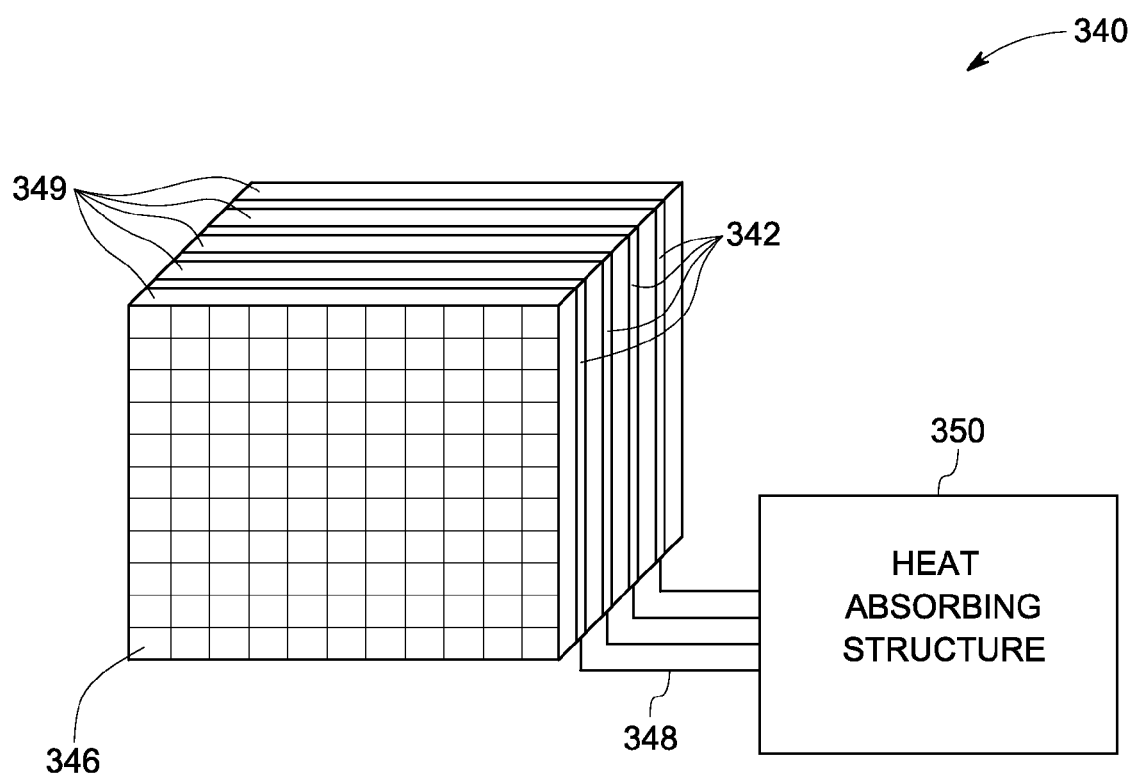
FIG. 27 is a schematic representation of an embodiment of an article according to the invention.

Referring to FIG. 27, a component of a video display system used in a video game 340 includes a display structure including a stack of display layers 344. The stack further comprises thermal dissipation layers 342, placed between every two-display layers. Each display layer is formed. The layers may be placed apart as shown in article 10 or may be bonded together to form an article 20. The vertical grid lines and the horizontal grid lines on the surface of the stack identify pixels 346 in the layer. Each pixel includes a substrate, a first organic electronic device, a second organic electronic device and a controller as described above in FIG. 20. The controller connects to both the first light transmissive organic electronic device and the second light transmissive organic electronic device. The controller can control the first light transmissive organic electronic device and the second light transmissive organic electronic device by varying an applied voltage bias. The thermal dissipation layers are in thermal communication 348 with a heat absorbing structure 350.

In one embodiment, the article of the invention may include additional layers such as one or more of a barrier layer, an abrasion resistant layer, an adhesion layer, a chemically resistant layer, a photoluminescent layer, a radiation-absorbing layer, a radiation reflective layer, a planarizing layer, an optical diffusing layer, and a light management film.

The barrier layer may include a graded composite barrier coating having an organic component and an inorganic component may be used with a suitable OLED layer. The barrier coating may have greater than 50 percent light transmission of light in the visible wavelength. In one embodiment, the barrier coating light transmission level may be in a range of from about 50 percent to about 60 percent, from about 60 percent to about 70 percent, from about 70 percent to about 80 percent, from about 80 percent to about 90 percent, or greater than about 90 percent transmission of light in the visible wavelength.

A suitable graded composite barrier coating may be the reaction product of reacting plasma species that are deposited onto a substrate surface. Organic coating materials may include carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, and aromatics having up to about 15 carbon atoms. Suitable inorganic coating materials may include an aluminide, boride, carbide, nitride, oxide, or silicide of an element from Groups IIA, IIIA, IVA, VA, VIA, VIIA, IB, and IIB; metals of Groups IIIB, IVB, and VB of the periodic table of elements. Other suitable inorganic materials may include an aluminide, boride, carbide, nitride, oxide, or silicide of one or more rare-earth metals.

Light management films may be used in the article to help mask physical defects, such as for example, specks, lint, and scratches, and also defects that may be observed due to optical phenomena. The light management films provide control over the direction of light, transmitted and/or reflected. The films may be used to increase brightness or to reduce glare in articles. In one embodiment, the light management film is disposed on an outermost surface of the stack. The light management films may assist in minimizing formation of wet-out effect or Newton's rings in a multi-layer display article or device.

Suitable light enhancement films may be flexible or rigid depending on the application. Suitable materials that may be used to prepare the light enhancement films include polymeric materials, such as, for example, acrylics and polycarbonates having nominal indices of refraction of 1.493 and 1.586, respectively. Other useful polymers are polypropylene, polyurethane, polystyrene, polyvinyl chloride, and the like. The particular polymeric material selected is not significant to the invention hereof, so long as it provides the light management function.

The light management films may be suitably designed based on the desired effect. The randomized height variations in light management films may be introduced in the form of prisms/facets formed in any optically useful shape, including lenticular arrays, prisms with rounded peaks and/or valleys, or curved facets. The variations may include the difference in height of the peaks, depth of the valleys, and periodicity of the peaks/valleys, to provide the desired effects. The surface so formed may be referred to as anti wet-out surface. The anti wet-out surface in the films may be produced using a tool manufactured by any known method. For example, if the tool used to produce the film is a roll, it can be manufactured by thread cutting at a constant thread pitch or plunge cutting using a constant spacing between grooves or any other known method.

Figure 28:
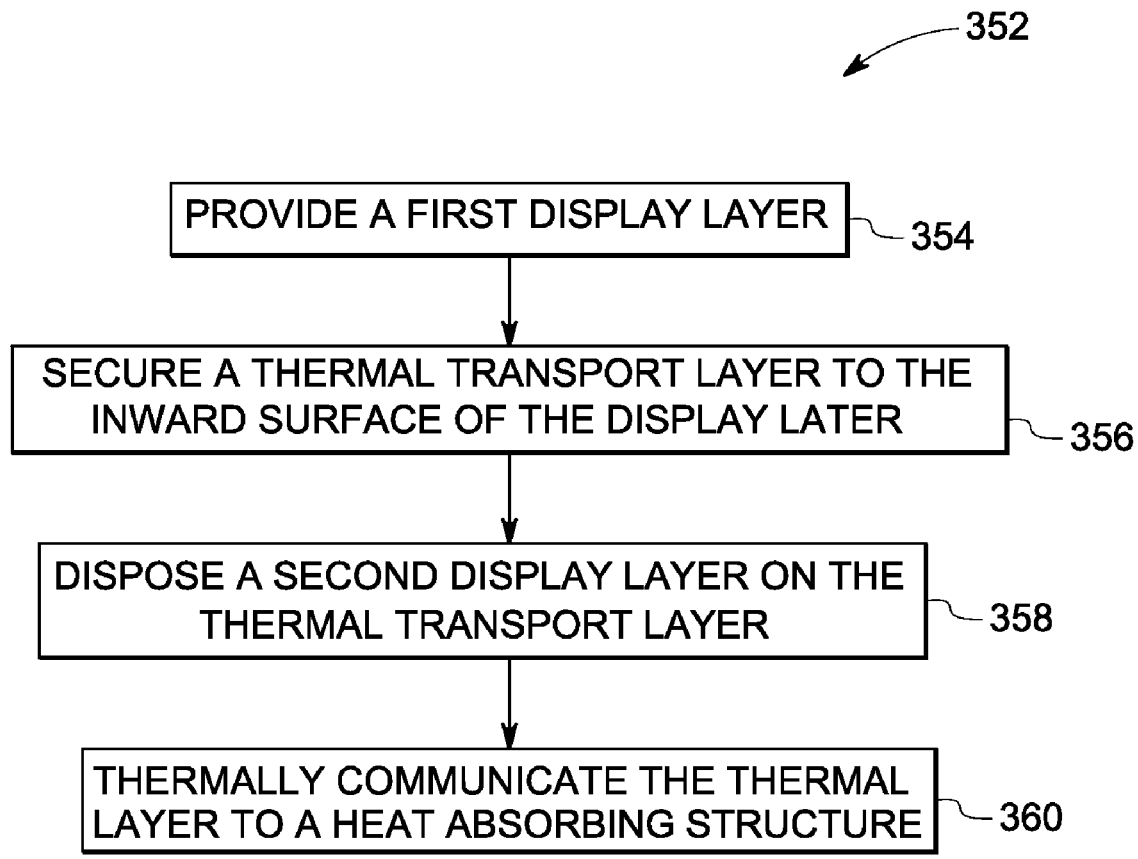
FIG. 28 is a flow chart illustrating a process of fabricating the article according to an embodiment of the invention.

FIG. 28 is a flow chart illustrating an exemplary process 352 of fabricating an article according to aspects of the invention. The process begins with step 354 of providing a first display layer including a substrate and a light-emitting device. The display layer may also include a controller. In a following step 356, a thermal transport layer is secured to the inward surface of the display layer. In a following step 358, a second display layer is disposed on the surface of the thermal transport layer. In a following step 360 the thermal transport layer is thermally communicated to a heat absorbing structure.

Securing or disposing the various layers including the device of the invention may be carried out using known techniques such as spin coating, dip coating, reverse roll coating, wire-wound or MAYER rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, lithographic processes, langmuir processes, and flash evaporation, vapor deposition, plasma-enhanced chemical-vapor deposition "PECVD", radio-frequency plasma-enhanced chemical-vapor deposition "RFPECVD", expanding thermal-plasma chemical-vapor deposition "ETPCVD", electron-cyclotron-resonance plasma-enhanced chemical-vapor deposition "ECRPECVD", inductively coupled plasma-enhanced chemical-vapor deposition "ICPECVD", and sputtering techniques including reactive sputtering.

EXAMPLES

The following examples are intended only to illustrate methods and embodiments in accordance with the invention, and as such should not be construed as imposing limitations upon the clauses. Unless specified otherwise, all ingredients are commercially available from such common chemical suppliers as Alpha Aesar, Inc. (Ward Hill, Mass.), Spectrum Chemical Mfg. Corp. (Gardena, Calif.), and the like.

Example 1

EL Material Synthesis

A sample of poly((N,N-ethylmethyl aminomethyl)styrene) (PS-Amine) is synthesized as follows: A solution of an isomeric mixture of poly(3-chloromethyl)styrene and poly (4-chloromethylstyrene) (2 grams, 13.2 millimoles) and N-ethylmethylamine (CAS No. 624-78-2, 11.8 grams, 200 millimoles) in 25 milliliters of toluene is stirred at room temperature for 5 days. The reaction mixture is a slurry containing precipitated solids. The reaction mixture is transferred to a separatory funnel and diluted with toluene. The organic phase is washed twice with 1 weight percent aqueous NaOH solution, twice with water, and the solvent is removed under vacuum. The tacky, white solid residue is dissolved in methanol and precipitated into water in a blender. The collected solid is air-dried, and then dried in a vacuum oven at 50 degrees Celsius to afford the reaction product of poly(N,N-ethylmethyl aminomethyl) styrene.

Example 2

A Transparent Organic Light-Emitting Device Fabrication

Preparation of Green/Red/Blue OLED
Step 1a: Preparation of a Green-Color Organic Light-Emitting Device (Green OLED).

A glass substrate is coated with a layer of indium tin oxide. Indium tin oxide is commercially available from Applied Films, Inc. (Evanston, Ill.). The coated substrate is exposed to ultraviolet radiation. A layer (ca. 60 nanometers) of poly(3, 4-ethylenedioxythiophene/polystyrene sulfonate (PEDOT: PSS) (BAYTRON® is commercially available from Bayer Corporation (Pittsburgh, Pa.)), is deposited onto the indium tin oxide coated substrates via spin-coating to form an intermediate. The intermediate is baked for 1 hour at 180 degrees Celsius in air to form a PEDOT layer. A layer (ca. 70 nanometers) of a green light-emitting polymer (LEP) (LUMATION® 1304 is commercially available from Dow Chemical (Midland, Mich.)) is spin-coated onto a surface of the PEDOT layer to form a green LEP layer. The samples are transferred to an argon filled glovebox nominally containing less than 1 parts per million of oxygen and moisture.

A solution of PS-amine in 1-butanol is spin-coated onto a surface of the green LEP layer to form a PS-amine layer (ca. about 5 nanometers to 8 nanometers). The PS amine layer is baked for 30 minutes at 90 degrees Celsius in air. Another ITO layer (ca. 110 nanometers) is sputtered onto the PS-amine layer surface using a CVC601 sputter tool at a base pressure of $1 \times 10^{-6}$ Torr to provide a green OLED. The ITO DC magnetron sputtering is carried out at a pressure of 0.7 millimeter Torr, with 30 standard cubic centimeter of argon and 8.5 standard cubic centimeter of oxygen under a sputter power density of 18.3 watts per square inch.

The samples are electrically grounded, unheated, and placed 1 inch away from sputter target. To achieve uniform ITO coatings, the substrates rotate at 4 seconds per cycle throughout the deposition process. The ITO layer is deposited in 11 minutes, corresponding to a deposition rate of ca. 1.7 Angstrom per second. The ITO coatings exhibit a sheet resistance of about 45 Ohm per square centimeter.

Optical transmittance is measured with an USB2000 Miniature Fiber Optic Spectrometer commercially available from Ocean Optics (Dunedin, Fla.). The device performance is characterized by measuring current-voltage-luminescence (I-V-L) characteristics and electroluminescence spectra. A photodiode calibrated with a luminance meter (MINOLTA LS-110) was used to measure the luminescence (in units of candela per square meter, $cd/m^2$). A plot of efficiency (measured in candela per ampere, cd/A) as a function of current density (measured in milliamperes per square centimeter, $mA/cm^2$) is obtainable for each device from its I-V-L data.

Step 1b: Preparation of a Red-Color Organic Light-Emitting Device

A similar procedure is followed as provided for the preparation of Green-color OLED except that the green-light-emitting polymer is replaced by a layer (ca. 70 nm) of a red light-emitting polymer (LEP) (RP145 obtainable from Dow Chemical).

Step 1c: Preparation of a Blue-Color Semitransparent Organic Light-Emitting Device A similar procedure is followed as provided for the preparation of Green-color OLED; except, the green-light-emitting polymer is replaced by a layer (ca. 65 nm) of a blue LEP (BP105 obtainable from Dow Chemical).

Step 2: Preparation of a ZnO-Based TFT.

A ZnO-based TFT is fabricated using a bottom gate configuration. A borosilicate glass substrate is coated with 200 nanometers thick ITO film and a 220 nanometers thick atomic layer deposition (ATO) film, obtainable from Planar Systems, Inc. (Beaverton, Oreg.). The ITO layer on the substrate has an average transmittance of 85 percent, a resistivity of $2.3 \times 10^{-4}$ Ohm centimeter, a carrier concentration of $7.7 \times 10^{20}$ centimeters$^{-3}$, and a mobility of 36 centimeter2/Volt-seconds6, serves as the gate electrode. The ATO film composed of a superlattice of alternating layers of $Al_2O_3$ and $TiO_2$, serves as the gate insulator. The ATO has a measured capacitance of about 60 nanoFaradays/centimeter$^2$ with a dielectric constant of about $16^{e0}$. First, a ZnO film 100 nanometers thick is deposited by sputtering on the precoated borosilicate glass using a RF (13.56 MHz) magnetron system. Next, the drain electrode and source electrode, both 300 nanometers thick ITO layers, are patterned on the borosilicate glass using the etching technique.

The resultant thin film bottom-gate type ZnO TFT shows good device performance of about 1 square centimeter/volts·second, on-off ratio of greater than 105, and a gate voltage swing of 4 volt/decade. The TFT shows a transparency of about 80 percent at a wavelength of 550 nanometers of visible light.

Step 3: Preparation of a Light-Emitting Device

A 500 nanometers thick layer of glass having a percentage transparency of 90 at a wavelength of 550 nanometers is the light transmissive layer. The green-OLED, red-OLED or the blue-OLED and the ZnO-based TFT, as prepared above, are both secured to the glass to form a first layer device. A second layer of glass is disposed over the first layer of the device. A second green-OLED secures to the second glass layer. The active emitting-areas of the two OLEDs overlap. The TFT is operably coupled with both the green-OLEDs. The assembly is aligned so that the emitted color consists of the light emitted by both the OLEDs based on the on-off condition of the TFT controller. The edges of the assembly are sealed with the NORLAND ADHESIVE to provide mechanical integrity.

Example 3

Display Layer Fabrication

A 500 nanometers thick layer of polycarbonate having a percentage transparency of 80 at a wavelength of 550 nanometers is used as the substrate. Light emitting devices, as prepared in step 3 of Example 2, are secured to the polycarbonate layer to form pixels on a display layer. Each pixel comprises a light emitting device comprising a red, green, and/or blue OLED and a TFT. The TFT is operably coupled with the OLEDs. The assembly is aligned such that the color emitted consists of the light emitted by the display layer based on the on-off condition of the TFT controllers. The edges of the assembly are sealed with the NORLAND ADHESIVE to provide mechanical integrity.

Example 4

Thermal Transport Layer Fabrication

Six samples are formed, each having a metal thermal transport layer. In sample 1, a gold (Au) layer is deposited on a display layer as prepared in Example 3. The Au layer, 99.9 percent pure, obtainable from Birmingham Metal Company Limited, (Birmingham, England) is deposited using an ion-beam sputtering method using commercially available Perkin-Elmer model 2400. The vacuum employed in the deposition chamber is in the order of $10^{-6}$ Torr. The display layer is maintained at room temperature (about 25 degrees centigrade) for the deposition of the Au layer. The resultant Au layer has an amorphous morphology. The sputtering rate is about 0.1 nanometers per second. The thickness of the Au layer is less than 20 nanometers and the layer is about 80 percent light transmissive at 550 nanometers. The layer has a thermal conductivity of 316 watts per meter Kelvin and an electrical conductivity of $45 \times 10^6$ per Watts per meter. In sample 2, a similar thermal transport layer is formed as in sample 1, except that silver (Ag) is used in place of gold. In sample 3, a similar thermal transport layer is formed as in sample 1, except that a silver-copper alloy (Ag:Cu) is used in place of gold. In samples 4-6, similar thermal transport layers are formed as in samples 1-3, except that the layer thicknesses are in a range of 20 nanometers to 50 nanometers. The silver layer in sample 2 has a thermal conductivity of about 387 W/mK at room temperature. The copper layer has a higher thermal conductivity entitlement than Au or Ag of samples 1 and 2, respectively.

Example 5

Thermal Transport Layer Fabrication

Six samples are formed, each having a metal thermal transport layer corresponding to a sample as formed in Example 4. A difference is that the display layer is heated from room temperature to a sputter temperature of about 200 degrees Celsius. The resultant metal thermal transport layers have a nanocrystalline morphology rather than an amorphous morphology. The sputtering rate is about 0.1 nanometers per second. The thickness of each thermal transport layer is less than 20 nanometers, or in a range of from 20 nanometers to 50 nanometers, as appropriate. Each thermal transport layer is about 80 percent light transmissive at 550 nanometers. The Au layer has a thermal conductivity of 316 watts per meter Kelvin and an electrical conductivity of $45 \times 10^6$ per Watts per meter.

Example 6

Thermal Transport Layer Fabrication

A hydrogenated amorphous carbon (a-C:H) film is deposited on a display layer as prepared in Example 3. The C:H film is deposited using plasmon enhanced chemical deposition (PECVD) method using commercially available from Nano-Master, Inc. NPE-4000PC controlled, stand-alone PECVD system that uses RF shower-head electrode of Hollow Cathode RF plasma source with Fractal Gas Distribution to generate plasma. The display layer is maintained at room temperature of about 25 degrees centigrade for the deposition for deposition of the C:H amorphous layer. The layer is deposited at a radio frequency of 13.56 mega hertz sustained in hydrocarbon gases. Here the PECVD technique employing RF and DC glow discharges in hydrocarbon gas mixtures produce smooth amorphous carbon film coating that has mixed $sp^2$ and $sp^3$ bonds. The resultant coating layer has a thickness of 1000 nanometers, mass density of 1.8 grams per cubic centimeter, refractive index of 2.0, and an amorphous morphology. The layer is at least 80 percent transparent at a wavelength of 550 nanometers and has a thermal conductivity of 1500 Watts per meter Kelvin.

Example 7

Thermal Transport Layer Fabrication

A layer of indium tin oxide (ITO) is deposited on a display layer as prepared in Example 3. The ITO is deposited on the display layer using a magnetron sputtering method. The ITO DC magnetron sputtering is carried out at a pressure of 0.7 millimeter Torr, with 30 standard cubic centimeter of argon and 8.5 standard cubic centimeter of oxygen under a sputter power density of 18.3 watts per square inch. The samples are electrically grounded, unheated, and placed 1 inch away from sputter target. To achieve uniform ITO coatings, the substrates rotate at 4 seconds per cycle throughout the deposition process. The ITO layer is deposited in 11 minutes, corresponding to a deposition rate of ca. 1.7 Angstrom per second. The ITO coatings so deposited exhibit a sheet resistance of about 45 Ohm per square centimeter. The film thickness is about 0.15±0.05 micrometers. Optical transmittance is analyzed with an USB4000 Miniature Fiber Optic Spectrometer commercially available from Ocean Optics (Dunedin, Fla.) and is about 75 percent transparent at a wavelength of 550 nanometers.

Example 8

Fabrication of an Article Having Display Layers and Thermally Conductive Thermal Transport Layers, Placed Alternately A first display layer is fabricated by securing a green light-emitting device as prepared in Example 2 to a polycarbonate substrate. A layer of ITO is deposited on the display layer by using the electron beam sputtering method as in Example 6. A second display layer is fabricated by securing a blue light-emitting device as prepared in Example 2 to a polycarbonate substrate. The second display layer is secured on the ITO layer such that the ITO layer is sandwiched between the first and the second display layer, as in Example 6. Again, a layer of ITO is deposited on the second display layer as in Example 6. The process is repeated until the article has 5 display layers and 4 thermal transport layers. And, each thermal transport layer is sandwiched between a pair of display layers. The thermal transport layer has about 80 percent heat removal efficiency.

Example 9

Fabrication of an Article Having Display Layers and Thermal Transport where the Dimensions of the Thermal Transport Layer Vary Across a Viewing Face of the Article A first display layer is fabricated by securing a green light-emitting device prepared in Example 2 to a polycarbonate substrate. A first layer of ITO is deposited on the display layer by using the electron beam sputtering method in Example 6. A second display layer fabricated by securing a blue light-emitting device prepared in Example 2 to a polycarbonate substrate is secured to the ITO layer. A third display layer fabricated by securing a red light-emitting device prepared in Example 2 to a polycarbonate substrate is then secured to the second display layer. A second layer of ITO is deposited on the third display layer. This is followed by securing a fourth display layer (green OLED) to the ITO layer and securing a fifth display layer (red OLED) to the fourth display layer. A third layer of ITO is deposited on the fourth display layer and a sixth display layer (blue OLED) is deposited on the third ITO layer. NORLAND adhesive is used to seal the sides of the article. The thickness of the ITO layers vary through the different locations of the display layers. The ITO layers between the first and second display layer and the fifth and sixth display layers have a thickness of about 130 micrometers. The ITO layer between the third and fourth display layer has a thickness of about 200 micrometers. The third and fourth display layers by virtue of their position in the article i.e., in the middle of the article may generate more heat than the first, second, fifth and sixth display layers during operation.

The heat generation differential may be exacerbated in that the areas that generate the most heat are the furthest distance from a heat dissipating device edge. The greater heat differential creates a larger thermal drive through the thermal transport layer. The placement and selection of the thermal transport layers allows more heat removal from high-heat generating areas. The net effect is a somewhat uniform heat distribution across the article. The thermal transport layers have greater than about 75 percent heat removal efficiency. With the thermal uniformity of the article, distortion due to heat-based refractive index and/or thermal expansion is minimized or eliminated.

Example 10

Fabrication of an Article Having Display Layers and Microfluidic Layers where the Channels of the Microfluidic Layer Vary Across the Article A first display layer is fabricated by securing a green light-emitting device as prepared in Example 2 to a glass substrate. A 100 micrometers thick layer of silica is deposited on the inward facing surface of the first display layer via spin coating. Semicircular shaped microfluidic channels are formed in the silica layer by continuous wave ablation at 0.488-micrometer wavelength. The laser pulse energy for ablation is about 1 Joule. The number of microfluidic channels in the portion corresponding to the center of the display layer which forms the main viewing section are lesser than the number of channels corresponding to the portion towards the periphery/boundary of the display layer. The center has one channel which then loops along the periphery of the display layer and is connected to three channels that loop along the periphery of the display layer.

A second display layer is fabricated by securing a red light-emitting device as prepared in Example 2 to a glass substrate. The second display layer is disposed on the polycarbonate layer via spin coating. This seals the semicircular shaped microfluidic channel from the top and forming a closed channel in the article. Water under a pressure of 6 psi is circulated through the microfluidic channels to carry the heat generated in the display layer away from the display layer. The microfluidic channels so formed cover about 50 percent of the surface area of the display and the heat removing efficiency is about 65 percent. The channels are in fluidic communication with a fluid pump that drives the heat-transporting fluid through the channels during use.

Example 11

Fabrication of an Article Having Elastic Wave Guides

An OLED display layer is fabricated as provided in Example 3 above; except, the substrate is made of silicon nitride. The substrate has a low-shear-modulus of 16 gigaPascal (GPa), and a thickness of 1000 nanometers. A second display layer is fabricated in the same manner as provided in Example 3 above; except, the substrate is made of (Al) doped ITO having a high shear modulus of 20 GPa and a thickness of 0.2 micrometers. The display layer formed on ITO (having a relatively high shear modulus) is placed between two display layers formed on silicon nitride (which has a relatively low shear modulus). The display layers on ITO guide elastic waves in contact therewith. Thus, heat (as an elastic wave) propagates through the display layer from localized heat spots to an external heat sink. The heat removing efficiency of the display layer is at least about 60 percent.

Example 12

Fabrication of an Article Having Elastic Wave Guides

An OLED display layer is fabricated as provided in Example 3 above; except, the substrate is made of ITO having a refractive index of 2.0 and a thickness of 0.2 micrometers. A second display layer is fabricated as provided in Example 3; except, the substrate is made of silica glass having a refractive index of 1.46 and a thickness of 2 micrometers. The display layer formed on ITO (having a higher refractive index) is placed between two display layers formed on silica glass (having a lower refractive index). The display layers on ITO guide elastic waves in contact therewith. Thus, heat (as an elastic wave) propagates through the display layer from localized heat spots to an external heat sink. The heat removing efficiency of the display layer is at least about 60 percent.

The embodiments described herein are examples of compositions, structures, systems and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

The invention claimed is:

1. An article, comprising:
   a display layer having an outward facing surface and an inward facing surface, and the display layer comprising a light-emitting device that generates heat and light during use; and
   a thermal transport layer secured to the display layer wherein the thermal transport layer is a microfluidic layer comprising a coolant that can transport heat generated by the light-emitting device away from the light-emitting device.

2. The article as defined in claim 1, wherein the thermal transport layer is secured to the inward facing surface, the outward facing surface or to both the inward and the outward facing surfaces of the display layer.

3. The article as defined in claim 1, wherein the thermal transport layer has a refractive index and the display layer has a refractive index and the refractive index differential between the thermal transport layer and the display layer is less than 0.1.

4. The article as defined in claim 1, wherein the thermal transport layer has a refractive index and the display layer has a refractive index and the refractive index of the thermal transport layer is equal to the refractive index of the display layer.

5. The article as defined in claim 1, wherein the thermal transport layer comprises a polymeric material.

6. The article as defined in claim 1, wherein the thermal transport layer comprises a silicon-containing material.

7. The article as defined in claim 1, wherein the thermal transport layer is light transmissive and is located between the display layer and a viewer of the display layer.

8. The article as defined in claim 1, wherein the thermal transport layer has a thickness that is in a range of from about 1 micrometer to about 1000 micrometers.

9. The article as defined in claim 1, wherein the thermal transport layer has a flexural strength in a range of from about 10 gigaPascal to about 400 gigaPascal.

10. The article as defined in claim 1, wherein the coolant can absorb heat from the display layer while in the channel.

11. The article as defined in claim 1, wherein the coolant comprises a fluid, and the fluid is a liquid having a viscosity in a range of from about $1 \times 10^{-3}$ Pascal second to about $10 \times 10^{-3}$ Pascal second.

12. The article as defined in claim 1, wherein the thermal transport layer has a refractive index and the coolant has a refractive index, and the refractive index differential between the thermal transport layer and the coolant is less than about 0.1 at a defined operation temperature.

13. The article as defined in claim 1, wherein the coolant layer has a refractive index and the display layer has a refractive index and the refractive index differential between the coolant and the display layer is less than 0.1.

14. The article as defined in claim 1, wherein the channel has a length sufficient to traverse at least about 80 percent of an area defined by the display layer.

15. The article as defined in claim 1, wherein the channel has an outer diameter of about 0.2 micrometers to about 2 micrometers and an inner diameter in a range of from about 0.1 micrometers to about 1 micrometers.

16. The article as defined in claim 15, wherein the inner diameter and the outer diameter of the channel are greater in a first zone of the display layer that generates relatively more heat than the corresponding diameters in another zone of the display layer that generates relatively less heat.

17. The article as defined in claim 1, wherein the channel is entirely sandwiched between the display layers.

18. The article as defined in claim 1, wherein the channel has about 2 to about 2000 turns to loop back as it traverses the display layer area.

19. The article as defined in claim 1, wherein the channel has a pitch in a range of from about 5 millimeter to about 50 millimeter from one loop to another loop based on the size of the display layer.

20. The article as defined in claim 1, wherein the channel is one of a plurality of channels.

21. The article as defined in claim 20, wherein the number of channels of the plurality of channels is greater in a first zone of the display layer that generates relatively more heat than the number of channels in another zone of the display layer that generates relatively less heat.

22. The article as defined in claim 21, wherein the zone of the display layer that generates relatively more heat than another zone of the display that generates relatively more heat is in the middle of the display layer.

23. The article as defined in claim 1, wherein the light-emitting diodes deeper in the stack are subject to relatively higher voltage potential and generate more heat than light-emitting diodes that are not as deep in the stack.

24. The article as defined in claim 1, wherein the channel flows around a peripheral edge of the display layer, and coolant dissipates carried heat at the peripheral edge.

25. The article as defined in claim 24, wherein there is a plurality of heat absorbing structures around the peripheral edge of the display layer in thermal communication with the coolant.

26. The article as defined in claim 25, wherein the heat absorbing structure comprises a synthetic jet, a heat exchanger, a heat spreader, a heat sink, a radiator, one or more Peltier devices, or a heat pipe.

27. The article as defined in claim 1, further comprising a heat dissipating structure in thermal communication with the coolant, and a heat exchanger spaced at a distance from the display layer.

28. The article as defined in claim 27, wherein the thermal transport layer is in thermal communication with the heat exchanger via a highly thermally conductive material such as metalized sheets, conductive glass coating, and porous structural carbon films.

29. The article as defined in claim 1, wherein the display layer is part of a stack of display layers.

30. The article as defined in claim 29, wherein the stack is a three-dimensional display stack.

31. The article as defined in claim 30, wherein there is at least two thermal transport layers for every one display layer of the stack.

32. The article as defined in claim 1, wherein the light-emitting device is an inorganic light-emitting device or a light-emitting nano-wire based device.

33. The article as defined in claim 1, wherein the light-emitting device is an organic light-emitting device.

34. The article as defined in claim 1, wherein the display layer further comprises a reversibly opacifying layer.

35. The article as defined in claim 34, wherein the opacifying layer responds to an electrical signal by switching to or from a light transmissive state from or to a light blocking or light absorbing state.

36. The article as defined in claim 34, wherein the opacifying layer is disposed on a surface of the display layer opposite to a surface of the display layer that emits light.

* * * * *